United States Patent
Noda et al.

(10) Patent No.: US 9,088,133 B2
(45) Date of Patent: Jul. 21, 2015

(54) TWO-DIMENSIONAL PHOTONIC CRYSTAL SURFACE EMITTING LASER

(71) Applicants: KYOTO UNIVERSITY, Kyoto-shi, Kyoto (JP); ROHM CO., LTD., Kyoto-shi, Kyoto (JP)

(72) Inventors: Susumu Noda, Kyoto (JP); Seita Iwahashi, Kyoto (JP); Toshiyuki Nobuoka, Kyoto (JP)

(73) Assignees: KYOTO UNIVERSITY, Kyoto (JP); ROHM CO., LTD., Kyoto (JP)

( * ) Notice: Subject to any disclaimer, the term of this patent is extended or adjusted under 35 U.S.C. 154(b) by 50 days.

(21) Appl. No.: 13/778,985

(22) Filed: Feb. 27, 2013

(65) Prior Publication Data

US 2013/0243026 A1    Sep. 19, 2013

(30) Foreign Application Priority Data

Feb. 28, 2012    (JP) .................. 2012-041399

(51) Int. Cl.
| | |
|---|---|
| H01S 5/10 | (2006.01) |
| H01S 5/12 | (2006.01) |
| H01S 5/18 | (2006.01) |
| B82Y 20/00 | (2011.01) |
| H01S 5/042 | (2006.01) |
| H01S 5/343 | (2006.01) |

(52) U.S. Cl.
CPC .................. *H01S 5/105* (2013.01); *B82Y 20/00* (2013.01); *H01S 5/1234* (2013.01); *H01S 5/18* (2013.01); *H01S 5/0425* (2013.01); *H01S 5/3432* (2013.01)

(58) Field of Classification Search
CPC ............................ H01S 5/105; H01S 5/18319
See application file for complete search history.

(56) References Cited

U.S. PATENT DOCUMENTS

| | | | | |
|---|---|---|---|---|
| 2008/0240179 | A1* | 10/2008 | Otsuka et al. | 372/26 |
| 2009/0010298 | A1* | 1/2009 | Kiyota | 372/96 |
| 2009/0016395 | A1* | 1/2009 | Noda et al. | 372/41 |
| 2009/0074024 | A1* | 3/2009 | Noda et al. | 372/50.12 |
| 2009/0121243 | A1* | 5/2009 | Erchak et al. | 257/96 |
| 2009/0268291 | A1* | 10/2009 | Wang et al. | 359/486 |
| 2012/0114006 | A1* | 5/2012 | Kawashima et al. | 372/50.12 |

FOREIGN PATENT DOCUMENTS

| | | | | | |
|---|---|---|---|---|---|
| EP | 1615472 | A1 * | 1/2006 | .......... | H01L 51/5262 |
| EP | 1879272 | A1 * | 1/2008 | ................ | H01S 5/12 |
| JP | A-2009-76900 | | 4/2009 | | |
| JP | 2010056338 | A * | 3/2010 | ................ | H01S 5/18 |

* cited by examiner

*Primary Examiner* — Julio J Maldonado
*Assistant Examiner* — Joshua King
(74) *Attorney, Agent, or Firm* — Oliff PLC

(57) ABSTRACT

Provided is a two-dimensional photonic crystal surface emitting laser having an active layer for generating light of a predetermined wavelength range by an injection of electric current and a two-dimensional photonic crystal layer provided on one side of the active layer, the layer having a plate-shaped base member in which modified refractive index areas whose refractive index differs from that of the base member are arranged.

16 Claims, 12 Drawing Sheets

LIGHT-RESONATING LATTICE 212A

LIGHT-EMITTING LATTICE 212B

LIGHT-RESONATING LATTICE 212A
+ LIGHT-EMITTING LATTICE 212B

ARRANGEMENT OF AIR HOLES 211

LIGHT-RESONATING LATTICE 212A

LIGHT-EMITTING LATTICE 312B

LIGHT-RESONATING LATTICE 212A + LIGHT-EMITTING LATTICE 312B

ARRANGEMENT OF AIR HOLES 311

LIGHT-RESONATING LATTICE 412A

LIGHT-EMITTING LATTICE 412B

LIGHT-RESONATING LATTICE 412A
+ LIGHT-EMITTING LATTICE 412B

ARRANGEMENT OF AIR HOLES 411

LIGHT-RESONATING LATTICE 512A

LIGHT-EMITTING LATTICE 512B

LIGHT-RESONATING LATTICE 512A
+ LIGHT-EMITTING LATTICE 512B

ARRANGEMENT OF AIR HOLES 511

LIGHT-RESONATING LATTICE 612A

LIGHT-EMITTING LATTICE 612B

UPPER ELECTRODE 651 AND/OR LOWER ELECTRODE 652

LIGHT-RESONATING LATTICE 612A

LIGHT-EMITTING LATTICE 712B

UPPER ELECTRODE 751 AND/OR LOWER ELECTRODE 752

TWO-DIMENSIONAL PHOTONIC CRYSTAL SURFACE EMITTING LASER

TECHNICAL FIELD

The present invention relates to a two-dimensional photonic crystal surface emitting laser, and more specifically, to a two-dimensional photonic crystal surface emitting laser which emits a laser beam in a direction inclined from the direction perpendicular to a surface thereof.

BACKGROUND ART

Semiconductor lasers have many advantageous features, such as smallness, inexpensiveness, low power consumption and long service life, and they are used in a wide variety of fields, such as light sources for optical recoding, light sources for communication, laser displays, laser printers and laser pointers. In normal types of laser displays or laser printers, the laser beam is controlled to scan a certain area so as to create characters or figures. In currently used semiconductor lasers, the scan operation is achieved by controlling the emitting direction of the laser beam by an additional, external element, such as a polygon mirror, MEMS (micro-electro mechanical system), micro mirror or acousto-optic device. However, adding such a scanning mechanism makes it difficult to create a semiconductor laser that is smaller in size, quicker in operation and higher in durability.

Based on this point of view, the present inventors have created a two-dimensional photonic crystal surface emitting laser whose beam-emitting direction is variable (Patent Document 1). This device is hereinafter called the "variable beam-direction two-dimensional photonic crystal surface emitting laser."

Initially, a normal type of two-dimensional photonic crystal surface emitting laser (which itself does not have a variable emitting direction) is hereinafter described as a basis for understanding the variable beam-direction two-dimensional photonic crystal surface emitting laser. Two-dimensional photonic crystal surface emitting lasers normally have an active layer and a two-dimensional photonic crystal layer consisting of a plate-shaped member in which modified refractive index areas whose refractive index differs from that of the plate-shaped member (and which consist of air holes or areas made of a material whose refractive index differs from that of the plate-shaped member) are periodically arranged. In this two-dimensional photonic crystal surface emitting laser, when electric charges are injected into the active layer, rays of light are generated within a wavelength range determined by the material of the active layer. Among the generated light, the light having a wavelength equal to a predetermined "in-medium wavelength" determined by the spatial period of the modified refractive index areas (i.e. the wavelength of light within the two-dimensional photonic crystal layer, which equals the wavelength of light in vacuum divided by the average refractive index of the two-dimensional photonic crystal layer) forms a standing wave, whereby a resonant state of light is created. For example, if the modified refractive index areas are arranged in a square lattice pattern, the resonant state of light is created when the in-medium wavelength coincides with the spatial period of the modified refractive index areas.

The light which has caused the resonation is scattered by the modified refractive index areas in various directions within the two-dimensional photonic crystal. When two rays of light respectively scattered by two neighboring modified refractive index areas in the direction perpendicular to the two-dimensional photonic crystal layer have an optical path difference equal to their wavelength, these rays of scattered light will be in phase. For example, this condition is satisfied if the modified refractive index areas are arranged in a square lattice pattern and the in-medium wavelength coincides with their spatial period. The rays of light which are in phase with each other and scattered in the perpendicular direction form a laser beam emitted in the direction perpendicular to the two-dimensional photonic crystal layer.

The variable beam-direction two-dimensional photonic crystal surface emitting laser described in Patent Document 1 has an active layer and a pair of two-dimensional photonic crystal layers which differ from each other in the spatial period of the modified refractive index areas. In this device, among the light generated in the active layer, two rays of light having different wavelengths which respectively correspond to spatial periods of the refractive index distributions of the two layers form standing waves, thus creating a resonant state in both of the two-dimensional photonic crystal layers. Due to the frequency difference between the two standing waves, a spatial beat occurs, causing the resulting laser beam to be inclined from the direction normal to the two-dimensional photonic crystal layers. Such an obliquely emitted laser beam is hereinafter called the "inclined beam." The angle (inclination angle) of the inclined beam from the normal to the two-dimensional photonic crystal layers increases as the aforementioned frequency difference increases. Therefore, by providing at least one of the two-dimensional photonic crystal layers with a refractive-index distribution whose spatial period varies depending on the in-plane position, it is possible to generate an inclined beam whose inclination angle changes depending on the position at which electric charges are injected into the active layer (i.e. the in-plane position where the laser oscillation occurs).

Providing the two-dimensional photonic crystal surface emitting laser with such an internal function of controlling the emitting direction of the inclined beam not only allows the devices in the aforementioned conventional application fields using semiconductor lasers to be smaller in size, quicker in operation and higher in durability, but also opens the possibility of creating new application areas, such as a mobile laser display, an inter-chip optical communication, or a laser knife to be incorporated in a capsule endoscope.

BACKGROUND ART DOCUMENT

Patent Document

Patent Document 1: JP-A 2009-076900

SUMMARY OF THE INVENTION

Problem to be Solved by the Invention

The variable beam-direction two-dimensional photonic crystal surface emitting laser described in Patent Document 1 uses a combination of two types of two-dimensional photonic crystals both of which have the characteristic of emitting a laser beam in the direction perpendicular to the two-dimensional photonic crystal layers. Therefore, the inclination angle is limited within a certain narrow range from 0° (i.e. the perpendicular to the two-dimensional photonic crystal layers). On the other hand, using a pair of two-dimensional photonic crystal layers having completely different periodic structures provides only a low degree of freedom of the design of the two-dimensional photonic crystal layers, because such a pair cannot produce beats of standing waves of light.

Furthermore, to produce beats in the variable beam-direction two-dimensional photonic crystal surface emitting laser described in Patent Document 1, it is necessary to align the paired two-dimensional photonic crystal layers so that the directions of their crystal axes having different spatial periods coincide with each other. Due to this condition, the laser beam can be emitted only in a direction where the projection of the laser beam on the two-dimensional photonic crystal layers matches the direction of the crystal axes.

The problem to be solved by the present invention is to provide a two-dimensional photonic crystal surface emitting laser which can emit a laser beam at a larger inclination angle and yet has a higher degree of freedom in the design of the two-dimensional photonic crystal layer, and furthermore, to provide a variable beam-direction two-dimensional photonic crystal surface emitting laser using the same.

Means for Solving the Problems

As a result of conducting various studies, the present inventors have conceived the idea of creating the following two types of crystal structures in the two-dimensional photonic crystal layer: (I) a first two-dimensional photonic crystal structure which has the function of forming a two-dimensional standing wave to create a resonant state of light of a predetermined wavelength but which does not have the function of emitting the light of the predetermined wavelength to the outside, and (II) a second two-dimensional photonic crystal structure which has the function of emitting the light of the predetermined wavelength to the outside (but which itself does not create the resonant state of light of the predetermined wavelength). In the following descriptions, the first two-dimensional photonic crystal structure is called the "light-resonating photonic crystal structure", and the second two-dimensional photonic crystal structure is called the "light-emitting photonic crystal structure." (For simplicity, the modifying expression "two-dimensional" is omitted from these terms.)

Thus, a two-dimensional photonic crystal surface emitting laser according to the present invention aimed at solving the aforementioned problem has a laminated structure including:
  a) an active layer for generating light within a predetermined wavelength range by receiving an injection of an electric current; and
  b) a two-dimensional photonic crystal layer made of a two-dimensional photonic crystal having a plate-shaped base member in which modified refractive index areas whose refractive index differs from that of the base member are arranged, wherein the two-dimensional photonic crystal layer includes:
    b-1) a light-resonating photonic crystal structure with modified refractive index areas located at lattice points of a light-resonating lattice whose periodicity is determined so that a resonant state of light of emission wavelength λ which is a wavelength within the aforementioned wavelength range is created by forming a two-dimensional standing wave while the light of emission wavelength λ is prevented from being emitted to the outside; and
    b-2) a light-emitting photonic crystal structure with modified refractive index areas located at lattice points of a lattice having a reciprocal lattice vector G'↑ in a reciprocal space, where the magnitude of the sum of the reciprocal lattice vector G'↑ and a wave vector k↑ corresponding to the emission wavelength λ within the light-resonating photonic crystal structure is smaller than (|k↑|/$n_{eff}$).

As the light-resonating photonic crystal structure, one of the hereinafter described three types of photonic crystal structures can be used. As the light-emitting photonic crystal structure, any type of two-dimensional periodic structure whose reciprocal lattice vector satisfies the hereinafter described predetermined conditions can be used.

That is to say, the two-dimensional photonic crystal surface emitting laser according to the first mode of the present invention has a laminated structure including:
  a) an active layer for generating light within a predetermined wavelength range by receiving an injection of an electric current; and
  b) a two-dimensional photonic crystal layer made of a two-dimensional photonic crystal having a plate-shaped base member in which modified refractive index areas whose refractive index differs from that of the base member are arranged, wherein the two-dimensional photonic crystal layer includes:
    b-1) a light-resonating photonic crystal structure with modified refractive index areas located at lattice points of a light-resonating (light amplifying) lattice which is a square lattice in real space, the square lattice having a lattice constant a determined by equation (1):

$$a = \frac{1}{\sqrt{2}} \frac{\lambda}{n_{eff}} \qquad (1)$$

where λ is an emission wavelength within the aforementioned wavelength range and $n_{eff}$ is an effective refractive index of the two-dimensional photonic crystal layer; and
    b-2) a light-emitting photonic crystal structure with modified refractive index areas located at lattice points of a lattice having a reciprocal lattice vector G'↑ in a reciprocal space, where the magnitude of the sum of the reciprocal lattice vector G'↑ and any of the wave vectors k↑=±(½)$b_1$↑±(½)$b_2$↑ corresponding to the emission wavelength λ, within the light-resonating photonic crystal structure (with an arbitrary combination of double signs, where $b_1$↑ and $b_2$↑ are two primitive reciprocal lattice vectors in the square lattice of the light-resonating photonic crystal structure) is smaller than (|k↑|/$n_{eff}$).

The two-dimensional photonic crystal surface emitting laser according to the second mode of the present invention has a laminated structure including:
  a) an active layer for generating light within a predetermined wavelength range by receiving an injection of an electric current; and
  b) a two-dimensional photonic crystal layer made of a two-dimensional photonic crystal having a plate-shaped base member in which modified refractive index areas whose refractive index differs from that of the base member are arranged, wherein the two-dimensional photonic crystal layer includes:
    b-1) a light-resonating (light amplifying) photonic crystal structure with modified refractive index areas located at lattice points which form a rectangular lattice in real space, the lattice points being determined by equation (2):

$$\frac{1}{2}\sqrt{\frac{1}{a_1^2}+\frac{1}{a_2^2}} = \frac{n_{eff}}{\lambda} \quad (2)$$

where $a_1$ and $a_2$ are lattice constants of the rectangular lattice, $\lambda$ is an emission wavelength within the aforementioned wavelength range and $n_{eff}$ is an effective refractive index of the two-dimensional photonic crystal layer; and b-2) a light-emitting photonic crystal structure with modified refractive index areas located at lattice points of a lattice having a reciprocal lattice vector $G'\uparrow$ in a reciprocal space, where the magnitude of the sum of the reciprocal lattice vector $G'\uparrow$ and any of the wave vectors $k\uparrow = \pm(\frac{1}{2})b_1\uparrow \pm(\frac{1}{2})b_2\uparrow$ corresponding to the emission wavelength $\lambda$ within the light-resonating photonic crystal structure (with an arbitrary combination of double signs, where $b_1\uparrow$ and $b_2\uparrow$ are two primitive reciprocal lattice vectors in the rectangular lattice of the light-resonating photonic crystal structure) is smaller than $(|k\uparrow|/n_{eff})$.

The two-dimensional photonic crystal surface emitting laser according to the third mode of the present invention has a laminated structure including:

a) an active layer for generating light within a predetermined wavelength range by receiving an injection of an electric current; and b) a two-dimensional photonic crystal layer made of a two-dimensional photonic crystal having a plate-shaped base member in which modified refractive index areas whose refractive index differs from that of the base member are arranged, wherein the two-dimensional photonic crystal layer includes:

b-1) a light-resonating (light amplifying) photonic crystal structure with modified refractive index areas located at lattice points which form a triangular lattice in real space, the lattice points being determined by equation (3):

$$a = \frac{2}{3}\frac{\lambda}{n_{eff}} \quad (3)$$

where a is a lattice constant of the triangular lattice, $\lambda$ is an emission wavelength within the aforementioned wavelength range and $n_{eff}$ is an effective refractive index of the two-dimensional photonic crystal layer; and b-2) a light-emitting photonic crystal structure with modified refractive index areas located at lattice points of a lattice having a reciprocal lattice vector $G'\uparrow$ in a reciprocal space, where the magnitude of the sum of the reciprocal lattice vector $G'\uparrow$ and any of the wave vectors $k\uparrow = (\frac{1}{3})b_1\uparrow + (\frac{1}{3})b_2\uparrow$, $(-\frac{2}{3})b_1\uparrow + (\frac{1}{3})b_2\uparrow$, and $(\frac{1}{3})b_1\uparrow - (\frac{2}{3})b_2\uparrow$ corresponding to the emission wavelength $\lambda$, within the light-resonating photonic crystal structure (where $b_1\uparrow$ and $b_2\uparrow$ are two primitive reciprocal lattice vectors in the triangular lattice of the light-resonating photonic crystal structure) is smaller than $(|k\uparrow|/n_{eff})$.

In any of the first through third modes, the two-dimensional photonic crystal layer may have a single-layer structure in which the light-resonating photonic crystal structure and the light-emitting photonic crystal structure are created in a superimposed form, or a double-layer structure having the combination of a first layer in which the light-resonating photonic crystal structure is created and a second layer in which the light-emitting photonic crystal structure is created.

In the case of the double-layer structure, both the first and second layers may be provided on one side of the active layer or be arranged so as to sandwich the active layer in between. The single-layer structure is advantageous in that a simpler structure can be obtained.

In any of the first through third modes, another layer, such as a cladding layer or a spacer layer, may also be provided in addition to the active layer and the two-dimensional photonic crystal layer.

The aforementioned wavelength range and the emission wavelength $\lambda$ respectively mean the wavelength range and the wavelength of light in vacuum. The effective refractive index $n_{eff}$ is the effective refractive index experienced by light within the two-dimensional photonic crystal layer. The emission wavelength $\lambda$ (in vacuum), the wavelength $\lambda_{PC}$ within the two-dimensional photonic crystal layer of the light with emission wavelength $\lambda$, and the effective refractive index $n_{eff}$ satisfy the relation $\lambda = n_{eff} \times \lambda_{PC}$. The phrase "with an arbitrary combination of double signs" means that any combination of the two double signs "$\pm$" included in the wave vectors $k\uparrow = \pm(\frac{1}{2})b_1\uparrow \pm(\frac{1}{2})b_2\uparrow$ in the first and second modes is possible. Specifically, it means that $k\uparrow$ is any one of the following four wave vectors: $+(\frac{1}{2})b_1\uparrow + (\frac{1}{2})b_2\uparrow$, $+(\frac{1}{2})b_1\uparrow - (\frac{1}{2})b_2\uparrow$, $-(\frac{1}{2})b_1\uparrow + (\frac{1}{2})b_2\uparrow$ and $-(\frac{1}{2})b_1\uparrow - (\frac{1}{2})b_2\uparrow$.

The light-resonating photonic crystal structure (I) and the light-emitting photonic crystal structure (II) in each of the first through third modes are hereinafter described in detail.

(I) Light-Resonating Photonic Crystal Structure (I-1) Light-Resonating Photonic Crystal Structure in First Mode The light-resonating photonic crystal structure in the first mode is a square lattice having a periodic structure whose lattice constant a satisfies equation (1). FIG. 1A schematically shows the periodic structure. In this light-resonating photonic crystal structure 10A, a resonant state of light whose wavelength $\lambda_{PC}$ is equal to $2^{0.5}$ times the lattice constant a is produced. The reason is as follows.

Light propagating through the two-dimensional photonic crystal layer is scattered in various directions (at the modified refractive index areas arranged) at the lattice points 11A of the square lattice of the light-resonating photonic crystal structure 10A. Among the scattered light, the light L1 which is scattered at one lattice point 111A in the direction different from the previous traveling direction by 180° ("180°-scattering") and the light L2 which is 180°-scattered at the nearest lattice point 112A have an optical path difference equal to their wavelength $\lambda_{PC}$ and create a resonant state due to interference. The light L3 which is scattered at the lattice point 111A in a direction different from the previous traveling direction by 90° ("90°-scattering") and light L4 which is 90°-scattered at the nearest lattice point 112A also have an optical path difference equal to their wavelength $\lambda_{PC}$ and create a resonant state due to interference. Thus, in the light-resonating photonic crystal structure in the first mode, two modes of the resonant state of light are respectively created by the 180°-scattering and the 90°-scattering, so that a two-dimensional standing wave (and not a one-dimensional one) is formed.

The light propagated through the two-dimensional photonic crystal layer is also scattered at the lattice points 11A in a direction at an angle from the plane of the layer. However, in the present case, no laser beam can be emitted in the direction perpendicular to the two-dimensional photonic crystal layer, because the light scattered in the direction perpendicular to the crystal layer at one lattice point (e.g. 111A) and the light scattered in the same direction at the nearest lattice point (e.g. 112A) have an optical path difference of $\lambda_{PC}/2$ and become out of phase with each other by π. (In a conventional two-dimensional photonic crystal surface emitting laser in which the lattice constant a is equal to the wavelength $\lambda_{PC}$, this optical path difference coincides with $\lambda_{PC}$ and the laser beam is emitted in the direction perpendicular to the two-dimensional photonic crystal layer.)

In the reciprocal space shown in FIG. 1B, the aforementioned two-dimensional standing wave can be explained as follows. In the reciprocal space, the two-dimensional standing wave is represented by four M points 13A on $(\pm\frac{1}{2}, \pm\frac{1}{2}) \times (2\pi/a)$ (with an arbitrary combination of double signs) corresponding to the wave number of light, or by wave vectors $k\uparrow$ connecting the origin of the reciprocal space and the M points. The wave vectors $k\uparrow$ are expressed as $k\uparrow = \pm(\frac{1}{2})b_1\uparrow \pm (\frac{1}{2})b_2\uparrow$, where $b_1\uparrow$ and $b_2\uparrow$ are the primitive reciprocal lattice vectors of the square lattice. That is to say, satisfying the relationship of equation (1) in real space is equivalent to satisfying this relationship in the reciprocal space.

The scattering of light at the lattice points 11A of the light-resonating photonic crystal structure 10A occurs when the sum of one wave vector $k\uparrow$ related to the M points and the reciprocal lattice vector $G\uparrow$ representing the lattice point 11A in the reciprocal space coincides with another wave vector which is also related to the same M points. (It should be noted that this reciprocal lattice vector $G\uparrow$ is different from the previously mentioned reciprocal lattice vector $G'\uparrow$, which represents the lattice points of the light-emitting photonic crystal structure in the reciprocal space.) The aforementioned 180° scattering can be expressed by the reciprocal lattice vectors $G_1\uparrow = \pm b_1\uparrow \pm b_2\uparrow$. The 90° scattering can be expressed by the reciprocal lattice vectors $G_2\uparrow = \pm b_1\uparrow$ or $G_2\uparrow = \pm b_2\uparrow$.

In the reciprocal space, whether or not the light will be emitted in an inclined direction with respect to the two-dimensional photonic crystal layer is also demonstrated. If there is a reciprocal vector whose sum with a wave vector is zero, the light will be emitted perpendicularly to the two-dimensional photonic crystal layer. However, such a reciprocal lattice vector $G\uparrow$ does not exist for the wave vectors $k\uparrow$ related to the M points. Furthermore, if the sum of a wave vector $k\uparrow$ and the reciprocal lattice vector $G\uparrow$ (i.e. $k\uparrow + G\uparrow$) is within a light cone 14A represented by a circle whose center is located at the origin of the reciprocal space and whose radius is equal to k (i.e. the magnitude of the wave vector $k\uparrow$) multiplied by $1/n_{\text{eff}}$, the light within the two-dimensional photonic crystal layer will be emitted to the outside without causing total reflection at the interface of the two-dimensional photonic crystal layer and the outside. However, such a reciprocal lattice vector does not exist for the wave vectors $k\uparrow$ related to the M points. Accordingly, in the first mode, the light-resonating photonic crystal structure itself does not have the function of emitting the resonating light from within the two-dimensional photonic crystal layer to the outside.

(I-2) Light-Resonating Photonic Crystal Structure in Second Mode

The light-resonating photonic crystal structure 10B in the second mode has a periodic structure with modified refractive index areas located at lattice points 11B of a rectangular lattice whose lattice constants $a_1$ and $a_2$ satisfy the aforementioned equation (2) (FIG. 2A). In this periodic structure, a two-dimensional standing wave having a wavelength $\lambda_{PC} = 2a_1 a_2 (a_1^2 + a_2^2)^{-0.5}$ is formed. In the reciprocal space, this two-dimensional standing wave is represented by four M points 13B expressed as $(\pm\frac{1}{2}) \times (2\pi/a_1), \pm\frac{1}{2} \times (2\pi/a_2))$ (with an arbitrary combination of double signs), or by wave vectors each of which connects the origin of the reciprocal space and one of the M points (FIG. 2B). The wave vectors $k\uparrow$ are expressed as $k\uparrow = \pm(\frac{1}{2})b_1\uparrow \pm (\frac{1}{2})b_2\uparrow$ (with an arbitrary combination of double signs), where $b_1\uparrow$ and $b_2\uparrow$ are the primitive reciprocal lattice vectors of the rectangular lattice. Similar to the light-resonating photonic crystal structure of the first mode, the present structure causes both the 180° scattering represented by the reciprocal lattice vectors $G_1\uparrow = \pm b_1\uparrow \pm b_2\uparrow$ (with an arbitrary combination of double signs) and the 90° scattering represented by the reciprocal lattice vectors $G_2\uparrow = \pm b_1\uparrow$ or $G_2\uparrow = \pm b_2\uparrow$. This means that a two-dimensional standing wave is formed. There is no reciprocal lattice vector $G\uparrow$ which satisfies the condition that the sum of a wave vector $k\uparrow$ and the reciprocal lattice vector $G\uparrow$ (i.e. $k\uparrow + G\uparrow$) is included within the light cone 14B. Accordingly, the present light-resonating photonic crystal structure itself does not have the function of emitting the resonating light from within the two-dimensional photonic crystal layer to the outside. It should be noted that the rectangular lattice in the second mode includes a face-centered rectangular lattice.

(I-3) Light-Resonating Photonic Crystal Structure in Second Mode

The light-resonating photonic crystal structure 10C in the second mode has a periodic structure with modified refractive index areas located at lattice points 11C of a triangular lattice whose lattice constant a satisfies the aforementioned equation (3) (FIG. 3A). In this periodic structure, a two-dimensional standing wave having a wavelength $\lambda_{PC} = 3a/2$ is formed. In the reciprocal space, this two-dimensional standing wave is represented by wave vectors $k\uparrow = (\frac{1}{3})b_1\uparrow + (\frac{1}{3})b_2\uparrow, (-\frac{2}{3})b_1\uparrow + (\frac{1}{3})b_2\uparrow$ and $(\frac{1}{3})b_1\uparrow - (\frac{2}{3})b_2\uparrow$, where $b_1\uparrow$ and $b_2\uparrow$ are two primitive reciprocal lattice vectors intersecting each other at an angle of 60° (FIG. 3B). In the case of triangular lattices, the points indicated by these wave vectors $k\uparrow$ are called the J points. The present light-resonating photonic crystal structure produces a two-dimensional standing wave by causing three modes of 120° scattering, i.e. the first 120° scattering represented by the reciprocal lattice vectors $G_1\uparrow = \pm b_1\uparrow$, the second 120° scattering represented by $G_2\uparrow = \pm b_2\uparrow$, and the third 120° scattering represented by $G_3\uparrow = \pm b_1\uparrow \pm b_2\uparrow$. There is no reciprocal lattice vector $G\uparrow$ which satisfies the condition that the sum of a wave vector $k\uparrow$ and the reciprocal lattice vector $G\uparrow$ (i.e. $k\uparrow + G\uparrow$) is included in the light cone 14C. Accordingly, the present light-resonating photonic crystal structure itself does not have the function of emitting the resonating light from within the two-dimensional photonic crystal layer to the outside.

(II) Light-Emitting Photonic Crystal Structure

In any of the first through third modes, the lattice structure of the light-emitting photonic crystal structure is created in such a manner that, in the reciprocal space, there is a reciprocal lattice vector $G'\uparrow$ which satisfies the condition that the magnitude $|k\uparrow + G'\uparrow|$ of a vector sum $\Delta k\uparrow = k\uparrow + G'\uparrow$ is smaller than $(|k\uparrow|/n_{\text{eff}})$, where $k\uparrow$ is a wave vector of light which is resonated within the light-resonating photonic crystal structure. The vector $\Delta k\uparrow$ represents the wave vector of light which results from the scattering of the light of wave vector $k\uparrow$ in the light-emitting photonic crystal structure (i.e. from a change in the direction of the wave vector). Accordingly, the light resonated within the light-resonating photonic crystal structure is scattered by the light-emitting photonic crystal structure, and the wave vector $\Delta k\uparrow$ of the scattered light exists within the light cone. Therefore, the light within the two-dimensional photonic crystal layer can be emitted to the outside without causing total reflection at the interface of the two-dimensional photonic crystal layer and the outside. Thus, a laser beam is obtained. In this process, the wave number components in the direction parallel to the two-dimensional photonic crystal layer are maintained at the interface. Accordingly, when the magnitude $|\Delta k\uparrow|$ the wave vector of the scattered light is zero, the laser beam is emitted perpendicularly to the two-dimensional photonic crystal layer. When the value of $|\Delta \vec{k}|$ differs from zero, an inclined beam having an inclination angle corresponding to the magnitude and direction of the wave vector $\Delta \vec{k}$ of the scattered light is obtained.

For example, as shown in FIG. 4A, when the light-emitting photonic crystal structure 15A in the first mode has modified refractive index areas 16A arranged in an oblique lattice pattern, it is possible to appropriately set the lattice constants $c_1$, $c_2$ and $\alpha$ (an intersecting angle of the lines connecting the lattice points) of the oblique lattice to form a reciprocal lattice vector $\vec{G'}$ so that the wave vector $\Delta \vec{k}$ of the scattered light is included within the light cone 14, as shown in FIG. 4B, whereby an inclined beam is obtained. The inclination angle θ of the inclined beam, and the azimuthal angle φ indicating the in-plane direction of the projection of the inclined beam on a plane parallel to the two-dimensional photonic crystal layer, can also be appropriately determined by calculation. For example, in a real space having an orthogonal coordinate system with the x and y directions corresponding to the directions of the two primitive translation vectors in the light-resonating photonic crystal structure, if the light-emitting photonic crystal structure is an oblique lattice whose primitive translation vectors are $\vec{c_1}=(r_1, 1)a$ and $\vec{c_2}=(r_2, 1)a$ (and accordingly, both the light-resonating photonic crystal structure and the light-emitting photonic crystal structure have the same lattice-point interval a in the y direction), $r_1$ and $r_2$ can be calculated by the following equations for desired values of the inclination angle θ and the azimuthal angle φ:

$$r_1 = \frac{n_{eff} + \sqrt{2}\sin\theta\sin\phi}{n_{eff} - \sqrt{2}\sin\theta\cos\phi} \quad (4)$$

$$r_2 = \frac{n_{eff} - \sqrt{2}\sin\theta\sin\phi}{n_{eff} - \sqrt{2}\sin\theta\cos\phi} \quad (5)$$

A method for deriving these equations (4) and (5) will be described later.

A variable beam-direction two-dimensional photonic crystal surface emitting laser can be obtained by providing any of the two-dimensional photonic crystal surface emitting lasers according to the first through third modes with a current-injecting position controller for controlling the position at which the electric current is injected into the active layer, and by designing the light-emitting photonic crystal structure so that its periodic structure varies depending on the position in the two-dimensional photonic crystal layer. In this variable beam-direction two-dimensional photonic crystal surface emitting laser, the light generated by injecting an electric current into a partial region of the active layer by the current-injecting position controller is introduced into a section of the two-dimensional photonic crystal layer corresponding to that region. Consequently, an inclined beam is emitted in a direction whose inclination angle θ and azimuthal angle φ are determined by the light-resonating photonic crystal structure and the light-emitting photonic crystal structure located at the aforementioned section of the two-dimensional photonic crystal layer.

The periodic structure of the light-emitting photonic crystal structure may be a structure having a plurality of modified spatial period areas created by dividing the inside of the two-dimensional photonic crystal layer into a plurality of areas and providing each of these areas with a different periodic structure. The light-emitting photonic crystal structure may otherwise be designed so that its periodic structure continuously varies depending on the position in the two-dimensional photonic crystal layer. The current-injecting position controller can be realized, for example, by using a pair of electrodes one or both of which are composed of a plurality of segmented electrodes arranged parallel to the active layer so that the selection of one or more electrodes for the injection of the electric current can be changed among the segmented electrodes.

Effect of the Invention

By the present invention, it is possible to obtain a two-dimensional photonic crystal surface emitting laser in which a resonant state of light with a desired wavelength can be created by the light-resonating photonic crystal structure and an inclined beam can be emitted in a desired direction by the light-emitting photonic crystal structure.

BEST MODE FOR CARRYING OUT THE INVENTION

Embodiments of the two-dimensional photonic crystal surface emitting laser (which is hereinafter called the "photonic crystal laser") are hereinafter described by means of FIGS. 5-14B.

First Embodiment

Figure 1A:
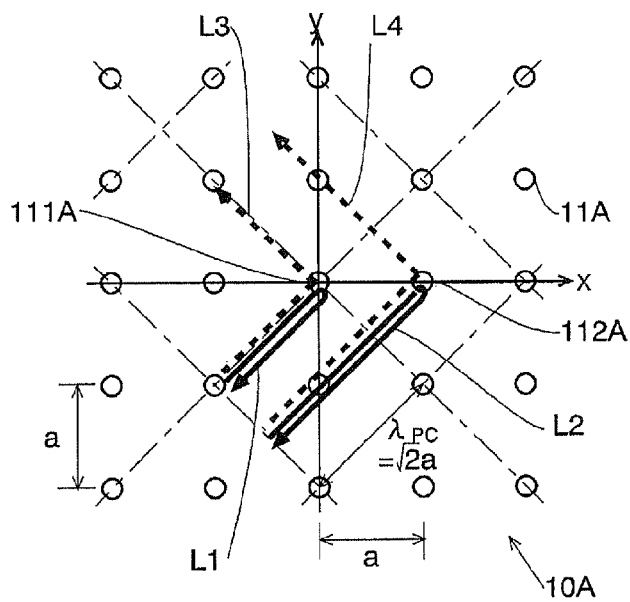
FIGS. 1A and 1B are diagrams showing a light-resonating photonic crystal structure in the two-dimensional photonic crystal surface emitting laser of the first mode in real space (FIG. 1A) and reciprocal space (FIG. 1B).
Figure 1B:
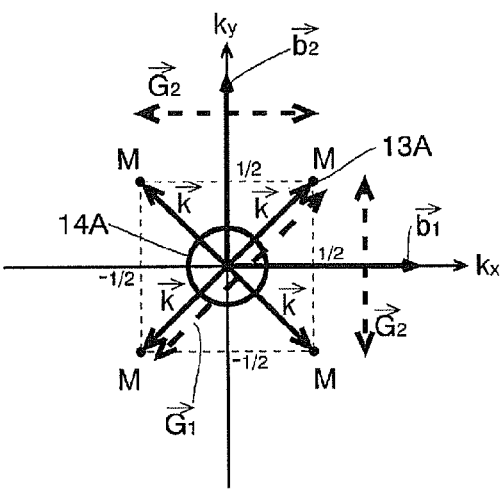
Figure 2A:
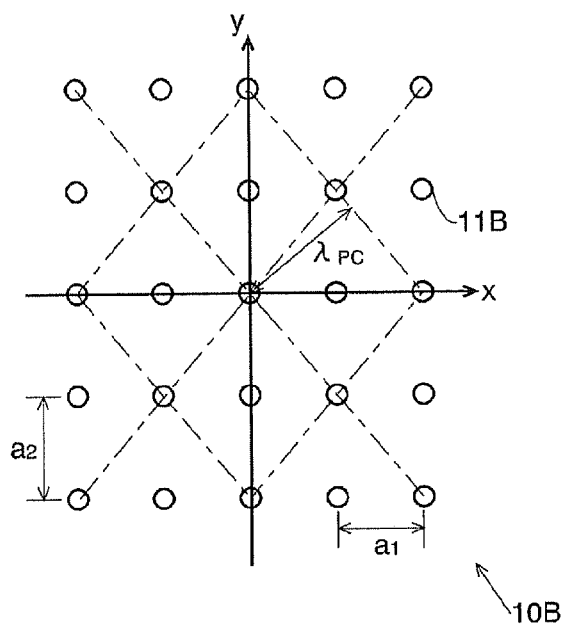
FIGS. 2A and 2B are diagrams showing a light-resonating photonic crystal structure in the two-dimensional photonic crystal surface emitting laser of the second mode in real space (FIG. 2A) and reciprocal space (FIG. 2B).
Figure 2B:
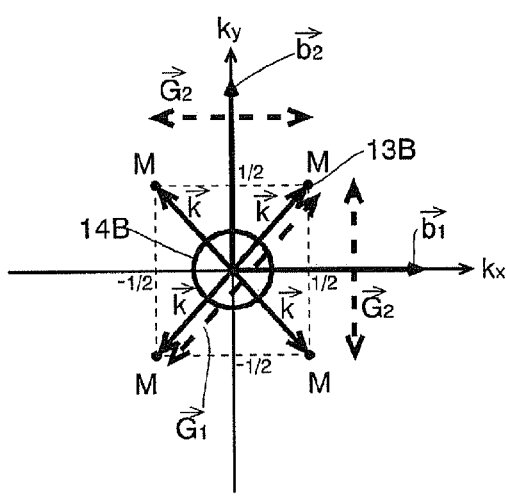
Figure 3A:
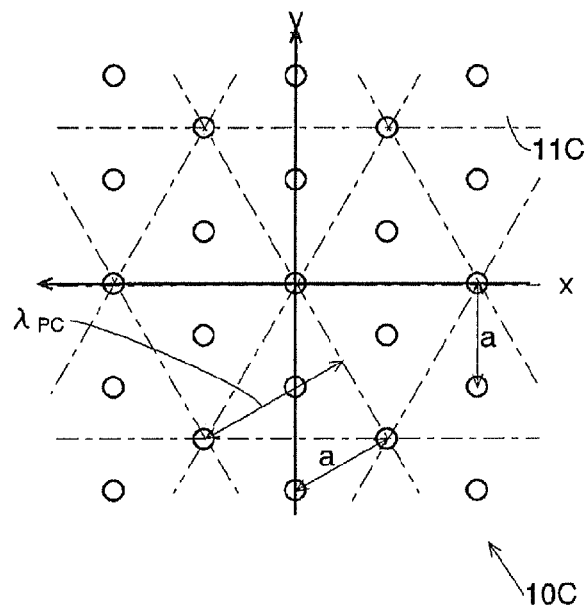
FIGS. 3A and 3B are diagrams showing a light-resonating photonic crystal structure in the two-dimensional photonic crystal surface emitting laser of the third mode in real space diagram (FIG. 3A) and reciprocal space (FIG. 3B).
Figure 3B:
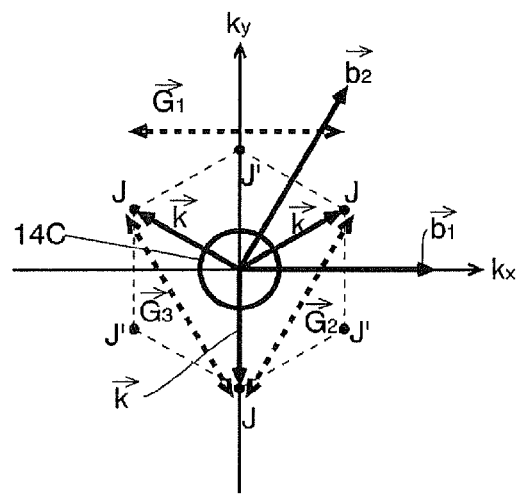
Figure 4A:
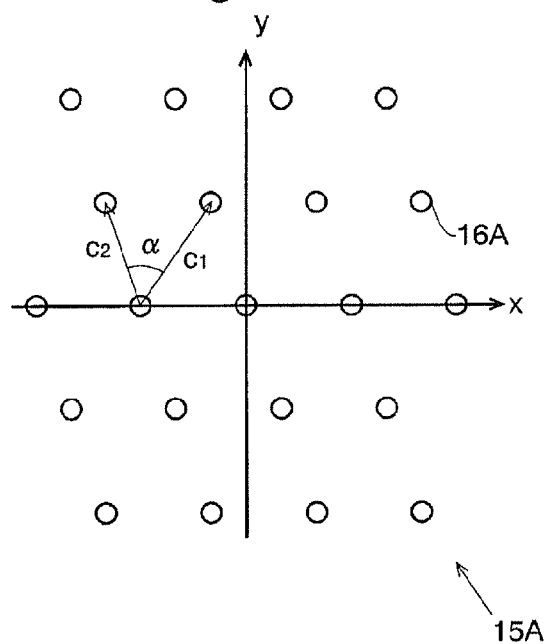
FIG. 4A is a diagram showing one example of the light-emitting photonic crystal structure.
Figure 4B:
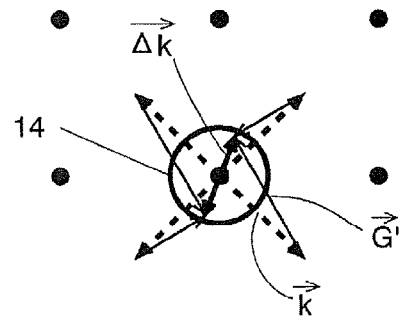
FIG. 4B is a diagram showing the state of scattering created by combining a light-resonating photonic crystal structure and a light-emitting photonic crystal structure.
Figure 5:
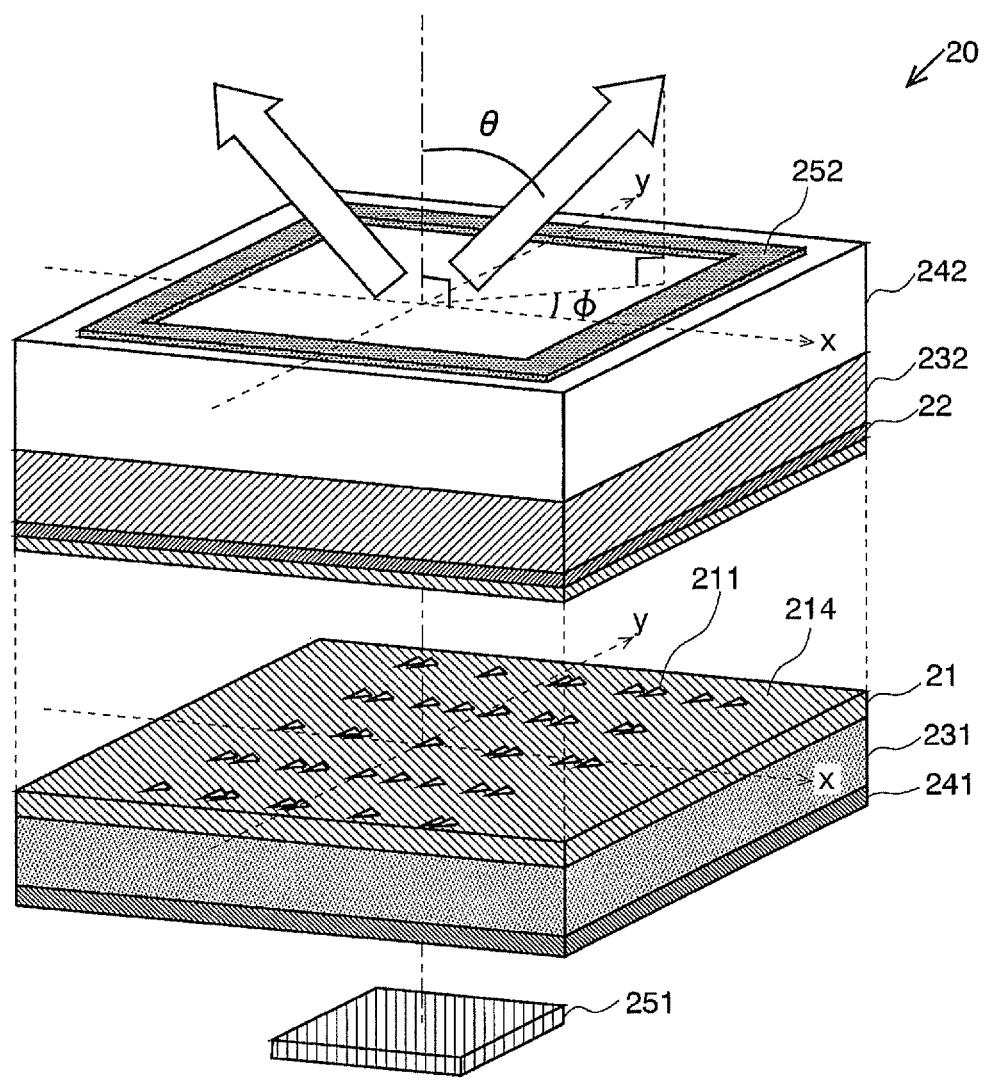
FIG. 5 is a perspective view showing one embodiment of the two-dimensional photonic crystal surface emitting laser according to the present invention.

FIG. 5 is a perspective view of a photonic crystal laser 20 of the first embodiment. This photonic crystal laser 20 includes a back-side electrode 251, a lower substrate 241, a first cladding layer 231, a two-dimensional photonic crystal layer 21, an active layer 22, a second cladding layer 232, an upper substrate 242 and a window-shaped electrode 252, which are stacked in the aforementioned order. In the photonic crystal laser 20 of the present embodiment, a laser beam is emitted through the cavity (window) 2521 provided at the center of the window-shaped electrode 252, in a direction inclined by an emission angle θ from the direction perpendicular to the surface of the upper substrate 242 on the side where the window-shaped electrode 252 is present. It should be noted that the two-dimensional photonic crystal layer 21 and the active layer 22 may be transposed. It should also be noted that, although the words "upper" and "lower" are used in the present patent application for ease of explanation, these words do not specify the direction (up/down) in which the photonic crystal laser should actually be used.

In the present embodiment, a p-type semiconductor of gallium arsenide (GaAs) was used for the lower substrate 241, an n-type GaAs was used for the upper substrate 242, a p-type aluminum gallium arsenide (AlGaAs) was used for the first cladding layer 231, and an n-type AlGaAs was used for the second cladding layer 232. The active layer 22 has a multiple-quantum well (MQW) structure made of indium gallium arsenide/gallium arsenide (InGaAs/GaAs). Gold was used as the material of both the back-side electrode 251 and the window-shaped electrode 252. It should be noted that the materials of these layers are not limited to the aforementioned ones; it is possible to use the same materials as used for the respective layers of conventional photonic crystal surface emitting lasers. A spacer layer or other types of layers may also be inserted between the aforementioned layers.

The two-dimensional photonic crystal layer 21 is a plate-shaped base member (slab) 214 having air holes (modified refractive index areas) 211 periodically located at lattice points which will be described later. In the present embodiment, a p-type GaAs is used as the material of the slab 214. In the present embodiment, the air holes 211 have an equilateral triangular shape, although it is possible to use a different shape, such as a circle. The material of the slab 214 is not limited to the aforementioned one; any material used for the slab in conventional photonic crystal lasers is available. As the modified refractive index areas, a member whose refractive index differs from that of the slab 214 (modified refractive index member) may be used instead of the air hole 211. Air holes are advantageous in that they can be easily created, while modified refractive index members are preferable in the case where the base member may possibly be deformed due to a processing heat or other factors.

Figure 6A:
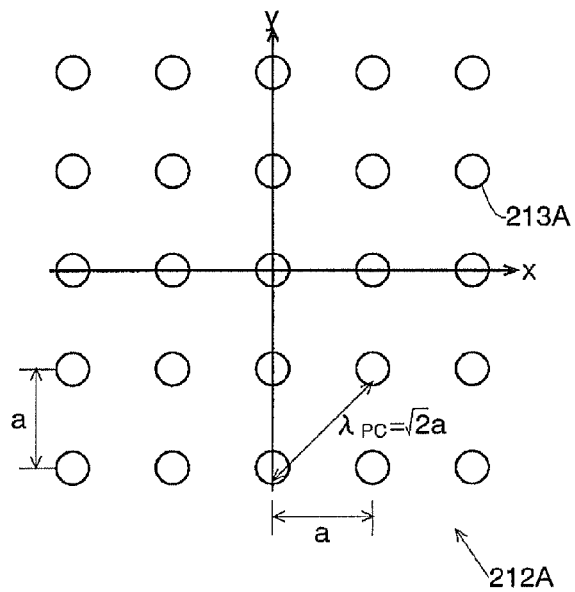
FIGS. 6A-6C are plan views showing the lattice points at which air holes (modified refractive index areas) are to be arranged in the two-dimensional photonic crystal layer in the two-dimensional photonic crystal surface emitting laser of the first embodiment.
Figure 6B:
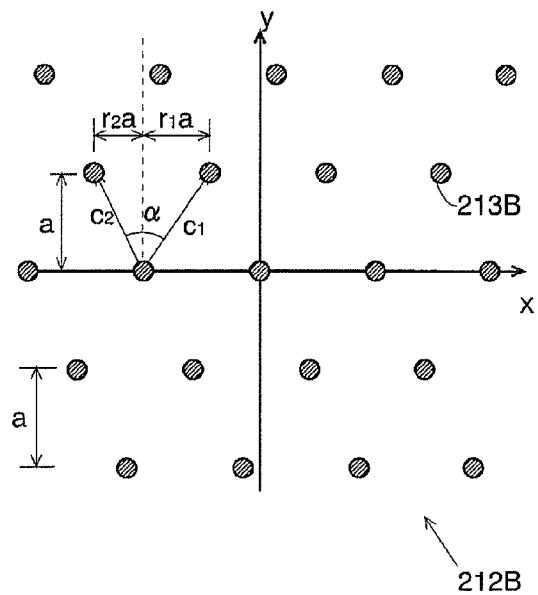
Figure 6C:
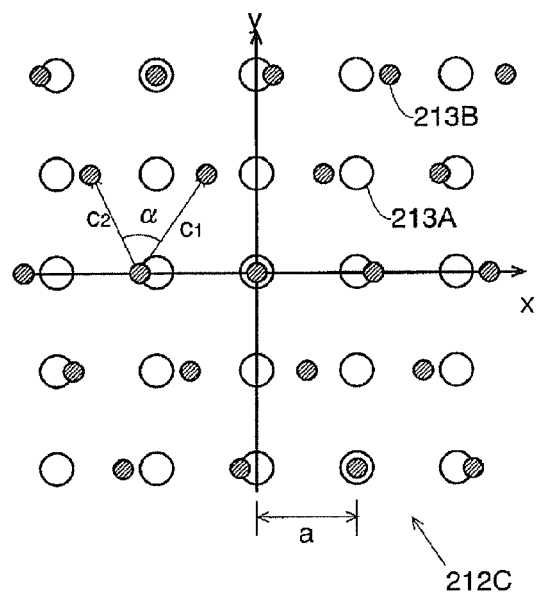

The lattice points at which the air holes 211 are arranged in the two-dimensional photonic crystal layer 21 are hereinafter described by means of FIGS. 6A-6D. The two-dimensional photonic crystal layer 21 of the present embodiment has a light-resonating lattice 212A which forms the light-resonating photonic crystal structure (FIG. 6A) and a light-emitting photonic crystal structure 212B which forms the light-emitting photonic crystal structure (FIG. 6B).

The light-resonating lattice 212A consists of a square lattice having a lattice constant a. In the following descriptions, one of the two directions in which the lattice points 213A are aligned is called the x direction, and the other is called the y direction. Accordingly, the x-y coordinates of one lattice point 213A can be expressed as (ma, na), where m and n are integers.

On the other hand, in the light-emitting lattice 212B, an oblique lattice having primitive translation vectors $c_1\uparrow=(r_1, 1)a$ and $c_2\uparrow=(r_2, 1)a$ is created. The lattice constants $c_1$ and $c_2$ of this oblique lattice are equal to the magnitudes of the primitive translation vectors $c_1\uparrow$ and $c_2\uparrow$, i.e. $(r_1^{0.5}+1)a$ and $(r_2^{0.5}+1)a$, respectively. The angle α between $c_1\uparrow$ and $c_2\uparrow$ satisfies the relationship of $\cos\alpha=(r_1 r_2+1)\times(r_1^2+1)^{-0.5}\times(r_2^2+1)^{-0.5}$. In both the light-resonating lattice 212A and the light-emitting lattice 212B, the lattice points 213B are arranged at intervals of a in the y direction.

In the present embodiment, it is assumed that the emission wavelength λ is 980 nm. The effective refractive index $n_{eff}$ of the two-dimensional photonic crystal layer 21 depends on the refractive index (3.55) of the p-type GaAs used as the material of the slab 214 and the area ratio of the air holes 211 (refractive index=1) to the slab 214. In the present embodiment, the area of the air holes 211 was regulated so that the two-dimensional photonic crystal layer 21 would have an effective refractive index of $n_{eff}=3.5$. Accordingly, by using equation (1), the lattice constant a in the present embodiment was set at $2^{-0.5}\times980$ nm/$3.5\approx200$ nm.

Figure 6D:
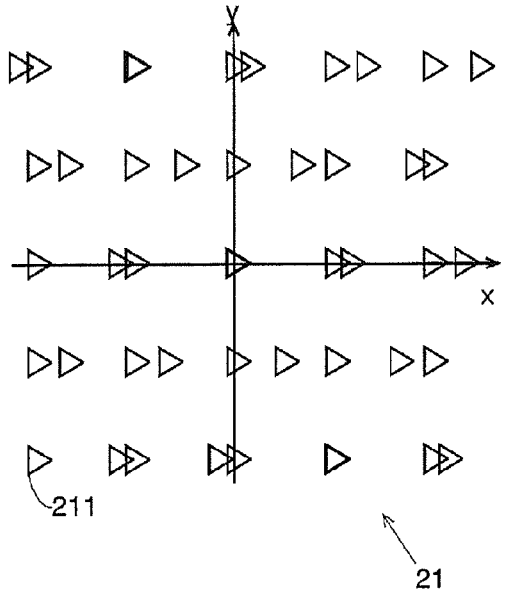
FIG. 6D is a plan view of the same layer with air holes arranged therein.

In the two-dimensional photonic crystal layer 21 of the present embodiment, the air holes 211 are located at the lattice points of a lattice 212C consisting of the light-resonating lattice 212A and the light-emitting lattice 212B superposed on each other (FIG. 6C), to create a photonic crystal structure (FIG. 6D).

In the two-dimensional photonic crystal layer 21 of the present embodiment, a laser beam is emitted in a direction where $r_1$ and $r_2$, which are the parameters indicating the position of the lattice points 213B, satisfy the aforementioned equations (4) and (5). The reason is as follows.

When voltage is applied between the back-side electrode 251 and the window-shaped electrode 252, electric charges are injected into the active layer 22, whereby a light of a predetermined wavelength range is generated. This light enters the two-dimensional photonic crystal layer 21 neighboring the active layer 22, and a component of light whose wavelength in this two-dimensional photonic crystal layer 21 ($\lambda/n_{\mathit{eff}}$) is equal to the lattice constant a multiplied by $2^{0.5}$, i.e. a light whose emission wavelength (in vacuum) is $\lambda$, creates a resonant state due to the light-resonating photonic crystal structure. As can be understood from the fact that the lattice constant a multiplied by $2^{0.5}$ corresponds to the length of the diagonal of the unit cell of the square lattice, the wave front of this light which causes the resonant state is directed at angles of $\pm 45°$ with respect to the x axis. The wave vector $k\uparrow$ of the light having such a wavelength and wave-front direction can be expressed as:

$$k_+\uparrow = (\tfrac{1}{2},\tfrac{1}{2})\times(2\pi/a) \tag{6}$$

for the light with the wave front directed at an angle of $+45°$, and $$k_-\uparrow = (\tfrac{1}{2},-\tfrac{1}{2})\times(2\pi/a) \tag{6'}$$

for the light with the wave front directed at an angle of $-45°$. These vectors $k_+\uparrow$ and $k_-\uparrow$ respectively correspond to the primitive reciprocal lattice vectors $b_1\uparrow$ and $b_2\uparrow$ of the light-resonating lattice 212A with the magnitudes multiplied by $\tfrac{1}{2}$.

On the other hand, the light-emitting lattice 212B has the aforementioned primitive translation vectors $c_1\uparrow=(r_1,1)a$ and $c_2\uparrow=(r_2,1)a$ in real space. Accordingly, the primitive reciprocal lattice vectors $d_1\uparrow$ and $d_2\uparrow$ of this lattice in the reciprocal space are expressed as follows:

$$d_1\uparrow = (1/(r_1 r_2), r_2/(r_1+r_2))\times(2\pi/a) \tag{7}$$

$$d_2\uparrow = (-1/(r_1+r_2), r_1/(r_1+r_2))\times(2\pi/a) \tag{8}$$

The reciprocal lattice vector G' in the light-emitting photonic crystal structure (which is different from the reciprocal lattice vector in the light-resonating photonic crystal structure) is expressed as $G'\uparrow = pd_1\uparrow + qd_2\uparrow$, where p and q are integers.

In the light-emitting photonic crystal structure, the light having the wave vector $k\uparrow$ is scattered into a different direction by the air holes 211 located at the lattice points 213B of the light-emitting lattice 212B. This scattering occurs in the direction indicated by the vector sum $\Delta k\uparrow$ of a wave vector $k\uparrow$ and the reciprocal lattice vector $G'\uparrow$ in the light-emitting photonic crystal structure. The following description deals with a vector sum of the wave vector $k_+\uparrow$ and the reciprocal lattice vector $G'\uparrow=-d_1\uparrow$ (p=−1, q=0). A similar result will also be obtained in the case of a vector sum of the wave vector $k_-\uparrow$ and the reciprocal lattice vector $G'\uparrow=+d_2\uparrow$ (p=0, q=1). The vector sum $\Delta k_-\uparrow$ is expressed as follows:

$$\Delta k\uparrow = k_+\uparrow - b_1\uparrow = ((r_1+r_2-2)/2(r_1+r_2), (r_1-r_2)/(r_1+r_2))\times(2\pi/a) \tag{9}$$

This vector $\Delta k\uparrow$ also needs to satisfy the following equations (10) through (12):

$$\sin\theta_{in} = |\Delta k\uparrow|/|k_+\uparrow| \tag{10}$$

$$\sin\theta_{in} = (1/n_{\mathit{eff}})\sin\theta \tag{11}$$

$$|\Delta k\uparrow| = \Delta k_x/\cos\phi = \Delta k_y/\sin\phi \tag{12}$$

where $\theta_{in}$ is the angle between the two-dimensional photonic crystal layer 21 and the direction in which the light propagates within the two-dimensional photonic crystal layer 21 after the scattering, $\theta$ and $\phi$ are the inclination angle and the azimuthal angle of the scattered light in the space outside the photonic crystal (in vacuum), respectively, and $\Delta k_x$ and $\Delta k_y$ are the x and y components of $\Delta k\uparrow$, respectively. Accordingly, the following equations can be obtained:

$$\Delta k_x = (|k_+\uparrow|/n_{\mathit{eff}})\sin\theta\cos\phi \tag{13}$$

$$\Delta k_y = (|k_+\uparrow|/n_{\mathit{eff}})\sin\theta\sin\phi \tag{14}$$

These equations (13) and (14) suggest that, when equations (10) through (12) are satisfied, the magnitude of $|\Delta k\uparrow|$ becomes smaller than the radius ($|k_+\uparrow|n_{\mathit{eff}}$) of the light cone, so that a laser beam can be extracted from the photonic crystal laser to the outside without causing total reflection.

Equations (9), (13) and (14) can be rewritten into the following system of equations with the variables $r_1$ and $r_2$:

$$(r_1+r_2-2)/2(r_1+r_2)\times(2\pi/a) = (|k_+\uparrow|/n_{\mathit{eff}})\sin\theta\cos\phi \tag{15}$$

$$(r_1-r_2)/(r_1+r_2)\times(2\pi/a) = (|k_+\uparrow|/n_{\mathit{eff}})\sin\theta\sin\phi \tag{16}$$

Solving this system of equations gives the aforementioned equations (4) and (5).

As explained thus far, it is possible to extract a laser beam from the photonic crystal laser to the outside at a desired inclination angle $\theta$ and azimuthal angle $\phi$ by satisfying the equations (4) and (5).

Figure 7A:
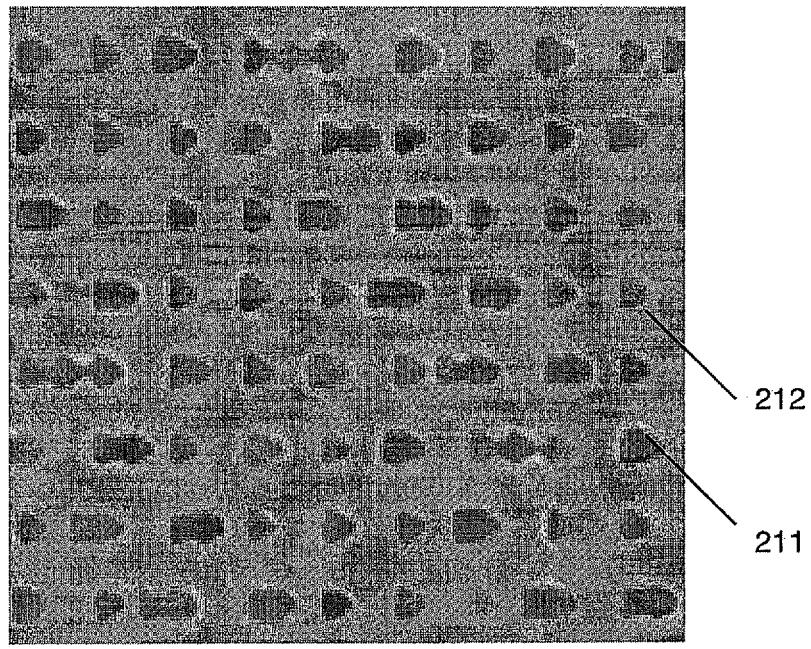
FIG. 7A is an electron microscopic picture of one example of the two-dimensional photonic crystal layer produced in the first embodiment.
Figure 7B:
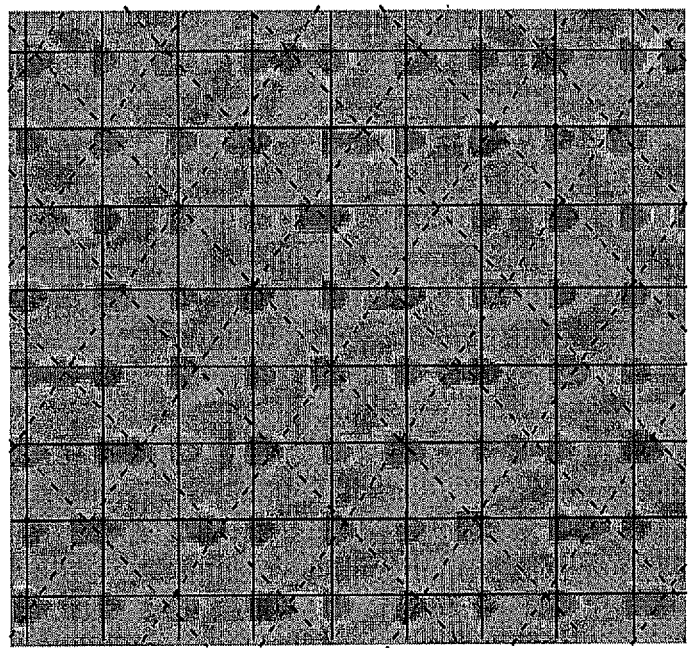
FIG. 7B is the same picture on which a square lattice corresponding to the light-resonating lattice (solid lines) and an oblique lattice corresponding to the light-emitting lattice (dashed lines) are drawn.

FIG. 7A shows an electron microscopic picture of an example of the two-dimensional photonic crystal layer 21 actually created in the present embodiment. This electron microscopic picture clearly shows that a number of air holes 211 having an equilateral triangular shape are arranged in the slab 214. These air holes 211 are located at the lattice points consisting of the square lattice (light-resonating lattice 212A) shown by the solid lines in FIG. 7B superposed on the oblique lattice (light-emitting lattice 212B) shown by the dashed lines in the same figure.

Figure 8:
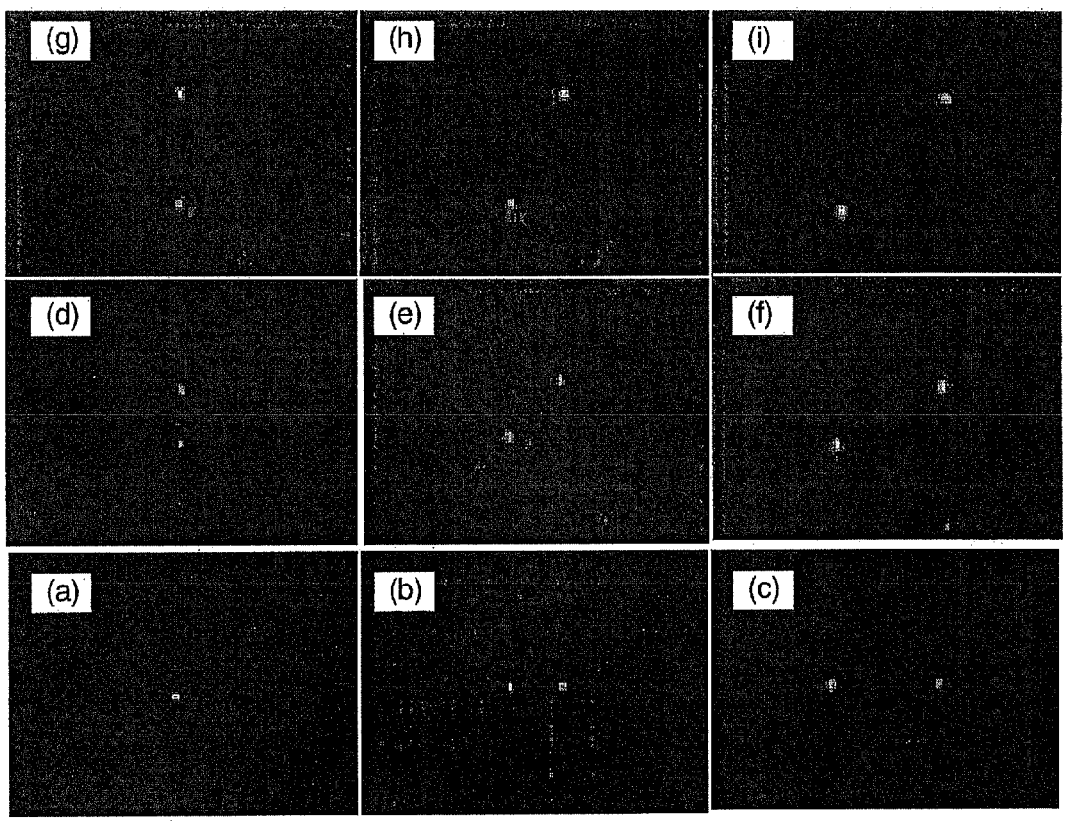
FIG. 8 is a set of photographs showing spots of laser beams obtained with two-dimensional photonic crystal surface emitting lasers produced in the first embodiment.
Figure 9A:
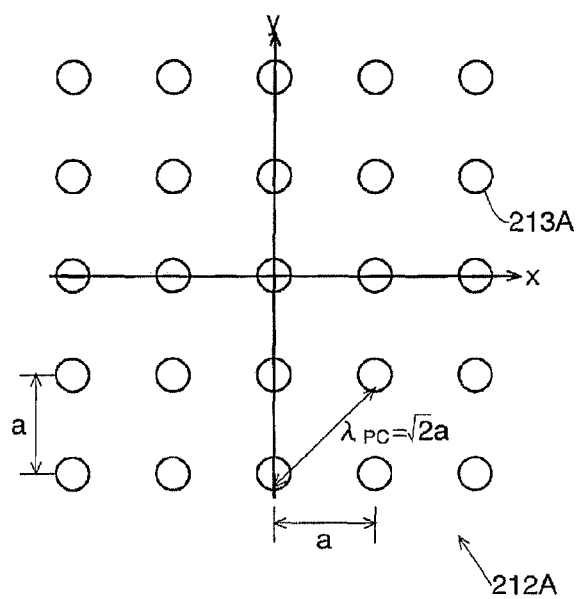
FIGS. 9A-9C are plan views showing the lattice points at which air holes (modified refractive index areas) are to be arranged in the two-dimensional photonic crystal layer in the two-dimensional photonic crystal surface emitting laser of the second embodiment.
Figure 9B:
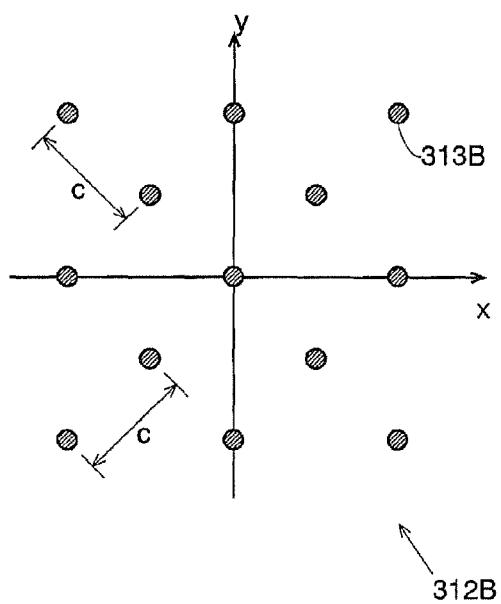
Figure 9C:
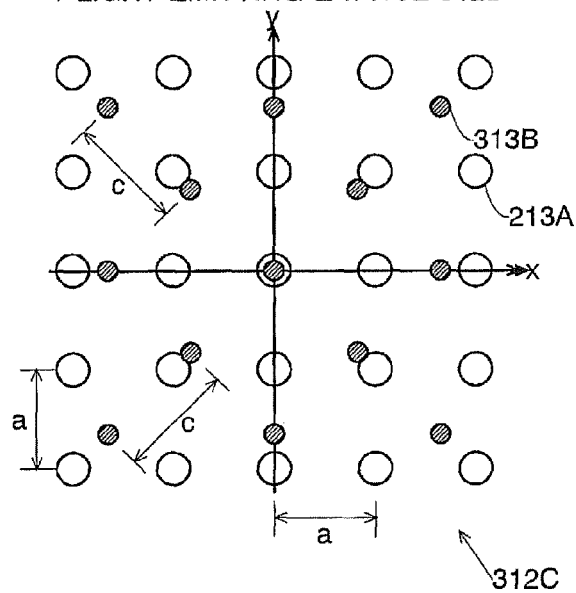
Figure 9D:
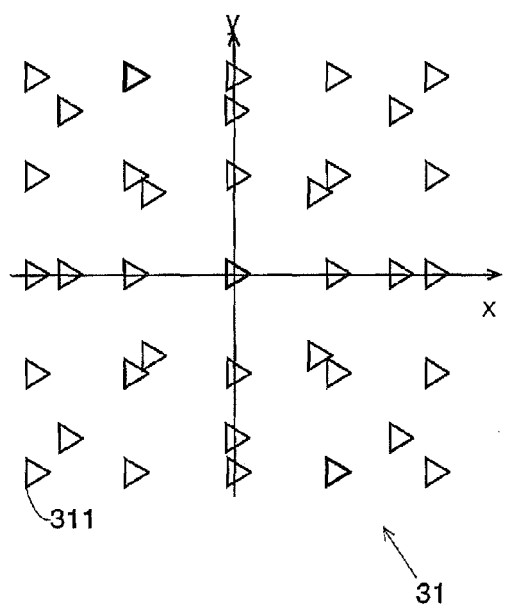
FIG. 9D is a plan view of the same layer with air holes arranged therein.
Figure 10A:
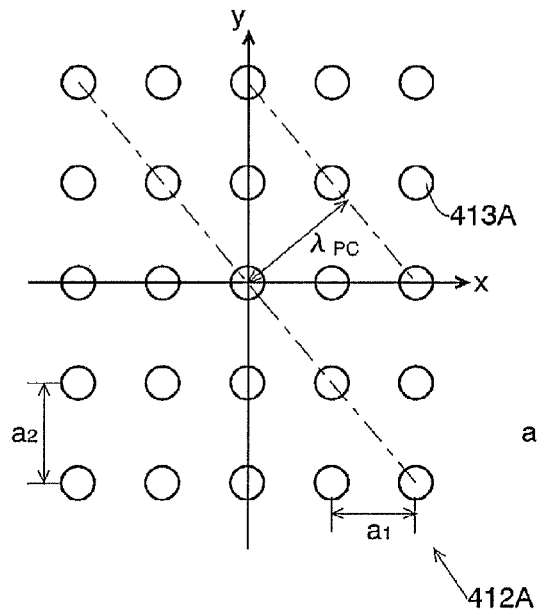
FIGS. 10A-10C are plan views showing the lattice points at which air holes (modified refractive index areas) are to be arranged in the two-dimensional photonic crystal layer in the two-dimensional photonic crystal surface emitting laser of the third embodiment.
Figure 10B:
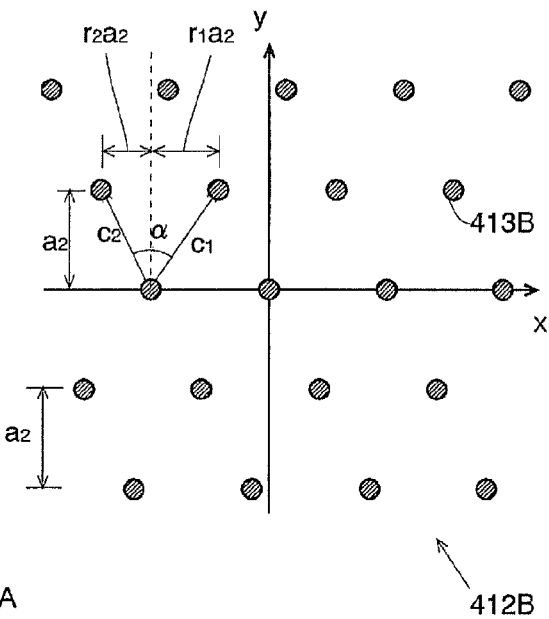
Figure 10C:
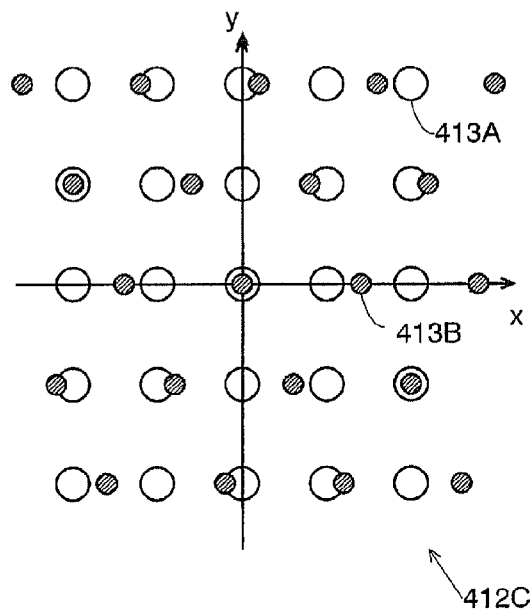
Figure 10D:
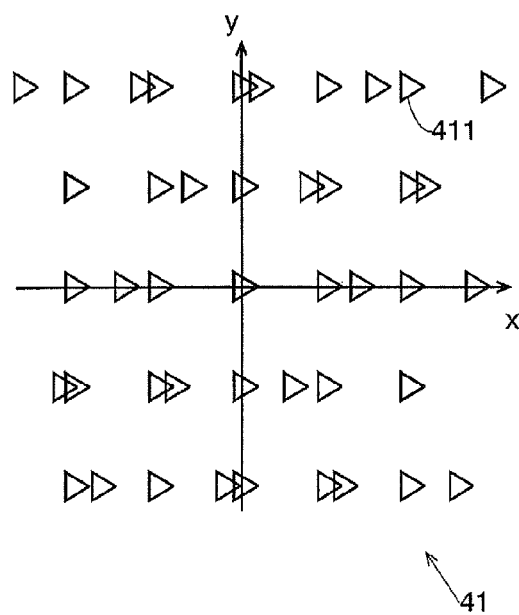
FIG. 10D is a plan view of the same layer with air holes arranged therein.
Figure 11A:
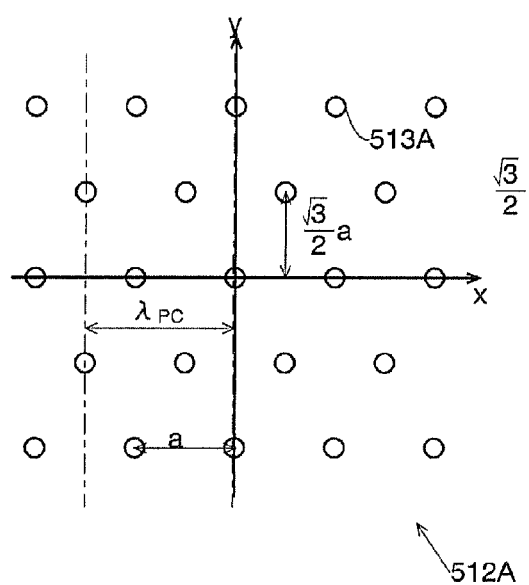
FIGS. 11A-11C are plan views showing the lattice points at which air holes (modified refractive index areas) are to be arranged in the two-dimensional photonic crystal layer in the two-dimensional photonic crystal surface emitting laser of the fourth embodiment.
Figure 11B:
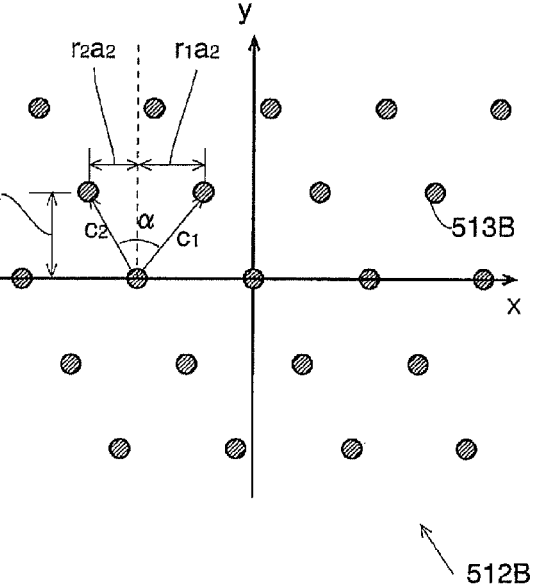
Figure 11C:
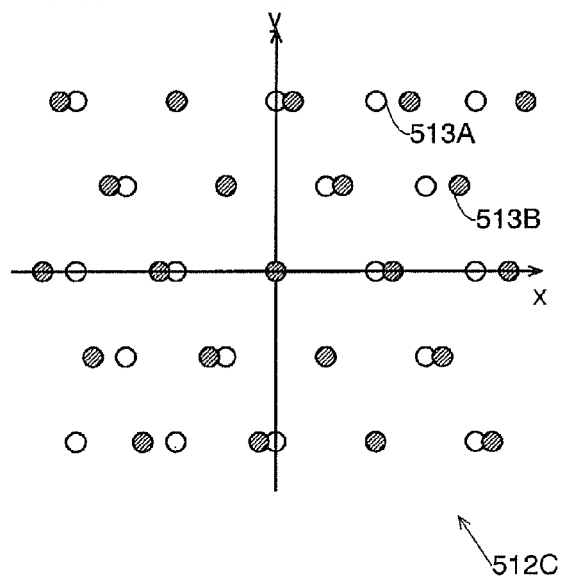
Figure 11D:
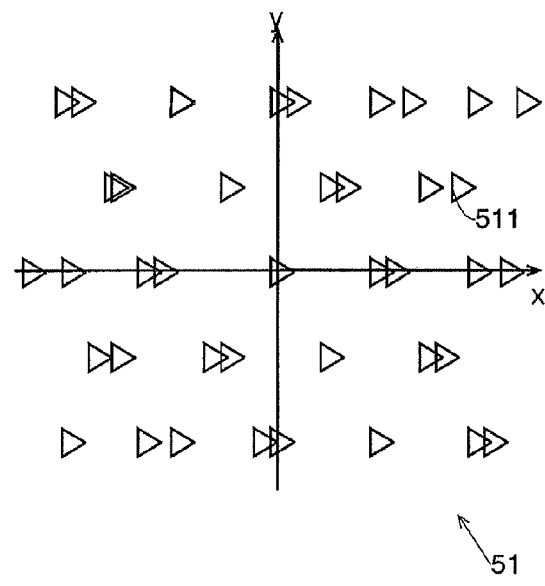
FIG. 11D is a plan view of the same layer with air holes arranged therein.

FIG. 8 is a set of photographs of laser beams obtained with the photonic crystal laser 10 created in the present embodiment. Each of these photographs shows a result of observation of laser beams on a plane parallel to the two-dimensional photonic crystal layer 21 at a position above the window-shaped electrode 252 of the photonic crystal laser 10. The white dots on the photographs are the spots of laser beams. In FIG. 8, photographs (a), (b) and (c) show the spots of laser beams obtained with the photonic crystal lasers 10 having $r_1$ and $r_2$ determined so that $\theta$ would be 0°, 10° and 20°, respectively, under the condition that $\phi$ in equation (4) was 0°. Photographs (a), (d) and (g) in FIG. 8 show the spots of laser beams obtained with the photonic crystal lasers 10 having $r_1$ and $r_2$ determined so that $\theta$ would be 0°, 10° and 20°, respectively, under the condition that cp in equation (4) was 90°. Photographs (e) and (f) show the spots of laser beams obtained with the photonic crystal lasers 10 having $r_1$ and $r_2$ calculated from $\theta$ and $\phi$ which were determined so that the positions of the spots in the y direction would be the same as in (d) and their positions in the x direction would be the same as in (b) and (c), respectively. Photographs (h) and (i) show the spots of laser beams obtained with the photonic crystal lasers 10 having $r_1$ and $r_2$ calculated from $\theta$ and $\phi$ which were determined so that the positions of the spots in the y direction would be the same as in (g) and their positions in the x direction would be the same as in (b) and (c), respectively. Any of these photographs (a)-(i) shows that the spots were obtained as designed, thus demonstrating that a laser beam which was inclined in the desired direction was obtained.

In the present embodiment, both the square lattice of the light-resonating lattice 212A and the oblique lattice of the light-emitting lattice 212B have the lattice points arranged at intervals of a in the y direction. It is also possible to arrange the light-resonating lattice and the light-emitting lattice so that they are directed in mutually unrelated directions. The light-emitting lattice is not limited to an oblique lattice; it may be a square lattice, rectangular lattice, face-centered rectangular lattice or triangular lattice. As one example, a configuration using a square lattice as the light-emitting lattice is described as the second embodiment.

Second Embodiment

The photonic crystal laser of the second embodiment is hereinafter described by means of FIGS. 9A-9D. In the photonic crystal laser of the second embodiment, a two-dimensional photonic crystal layer 31 which will be hereinafter described is used instead of the two-dimensional photonic crystal layer 21 in the photonic crystal laser 20 of the first embodiment. The other components of the photonic crystal laser of the present embodiment are the same as those of the photonic crystal laser 20 of the first embodiment.

The two-dimensional photonic crystal layer 31 is a plate-shaped slab having air holes (modified refractive index areas) 311 (FIG. 9D) located at the lattice points of a lattice 312C (FIG. 9C) consisting of the light-resonating lattice 212A (FIG. 9A) and a light-emitting lattice 312B (FIG. 9B) superposed on each other. The configuration of the light-resonating lattice 212A is the same as in the first embodiment. The shape of the modified refractive index areas, the material of the slab, and other elements are also the same as in the first embodiment. The light-emitting lattice 312B is a square lattice with a lattice constant c, whose crystal axes are rotated from those of the light-resonating lattice 212A (i.e. from the x and y directions) by 45° in the plane of the two-dimensional photonic crystal layer 31.

The wave vectors of the resonant light in the light-resonating lattice 212A are given by the aforementioned equations (6) and (6'). In the light-emitting lattice 312B, the primitive reciprocal lattice vectors of the reciprocal space are expressed as follows:

$$d_1\uparrow = (2\pi/(2^{0.5}c), 2\pi/(2^{0.5}c)) \quad (17)$$

$$d_2\uparrow = (-2\pi/(2^{0.5}c), 2\pi/(2^{0.5}c)) \quad (18)$$

Accordingly, in the case of a reciprocal lattice vector $G'\uparrow = -d_1\uparrow$, the following equation holds true for the wave vector $k_+\uparrow$ of the resonant light (equation (6)):

$$\Delta k \uparrow = k_+ \uparrow - d_1 \uparrow \quad (19)$$
$$= 2\pi\left((2a)^{-1} - (2^{0.5}c)^{-1}, (2a)^{-1} - (2^{0.5}c)^{-1}\right)$$

This vector is pointed in the direction at an angle of +45° from the x axis, with a magnitude of $(2a)^{-1} - (2^{0.5}c)^{-1}$. Accordingly, an inclined beam can be generated by determining the lattice constant c of the light-emitting lattice 312B so that the magnitude $(2a)^{-1} - (2^{0.5}c)^{-1}$ of this vector is smaller than the radius $(|k_+\uparrow|/n_{\mathit{eff}})$ of the light cone.

Third Embodiment

A photonic crystal laser of the third embodiment is hereinafter described by means of FIGS. 10A-10D. In the photonic crystal laser of the third embodiment, a two-dimensional photonic crystal layer 41 which will be hereinafter described is used instead of the two-dimensional photonic crystal layer 21 in the photonic crystal laser 20 of the first embodiment. The other components of the photonic crystal laser of the present embodiment are the same as those of the photonic crystal laser 20 of the first embodiment.

The two-dimensional photonic crystal layer 41 is a plate-shaped slab having air holes (modified refractive index areas) 411 (FIG. 10D) located at the lattice points of a lattice 412C (FIG. 10C) consisting of a light-resonating lattice 412A (FIG. 10A) and a light-emitting lattice 412B (FIG. 10B) superposed on each other. The shape of the modified refractive index areas, the material of the slab, and other elements are the same as in the first embodiment.

The light-resonating lattice 412A consists of a rectangular lattice having lattice constants $a_1$ and $a_2$ in the x and y directions, respectively. If air holes 411 are arranged in this light-resonating lattice 412A, the wave vector $k\uparrow$ of light which causes resonation will be as follows (with an arbitrary combination of double signs):

$$k\uparrow = (\pm(\tfrac{1}{2})\times(2\pi/a_1), \pm(\tfrac{1}{2})\times(2\pi/a_2)) \quad (20)$$

The light-emitting lattice 412B is an oblique lattice having primitive translation vectors $c_1\uparrow = (r_1,1)a_2$ and $c_2\uparrow = (r_2,1)a_2$. In both the light-resonating lattice 412A and the light-emitting lattice 412B, the lattice points 413B are arranged at intervals of $a_2$ in the y direction. The primitive reciprocal lattice vectors of this light-emitting lattice 412B are expressed as follows:

$$d_1\uparrow = (1/(r_1+r_2), r_2/(r_1+r_2))\times(2\pi/a_2) \quad (21)$$

$$d_2\uparrow = (-1/(r_1+r_2), r_1/(r_1+r_2))\times(2\pi/a_2) \quad (22)$$

The reciprocal lattice vector $G'\uparrow$ is expressed as $G'\uparrow = pd_1\uparrow + qd_2\uparrow$, where p and q are integers. An inclined beam can be generated by determining $r_1$ and $r_2$ so that the magnitude $|\Delta k\uparrow| = |k\uparrow + G'\uparrow|$ of the vector $\Delta k\uparrow = k\uparrow + G'\uparrow$ is smaller than the radius $|\Delta k\uparrow|/n_{\mathit{eff}}|$ of the light cone.

Fourth Embodiment

A photonic crystal laser of the fourth embodiment is hereinafter described by means of FIGS. 11A-11D. In the photonic crystal laser of the fourth embodiment, a two-dimensional photonic crystal layer 51 which will be hereinafter described is used instead of the two-dimensional photonic crystal layer 21 of the photonic crystal laser 20 of the first embodiment. The other components of the photonic crystal laser of the present embodiment are the same as those of the photonic crystal laser 20 of the first embodiment.

The two-dimensional photonic crystal layer 51 is a plate-shaped slab having air holes (modified refractive index areas) 511 (FIG. 11D) located at the lattice points of a lattice 512C (FIG. 11C) consisting of a light-resonating lattice 512A (FIG. 11A) and a light-emitting lattice 512B (FIG. 11B) superposed on each other. The shape of the modified refractive index areas, the material of the slab, and other elements are the same as in the first embodiment.

The light-resonating lattice 512A consists of a triangular lattice having a lattice constant a. If air holes 511 are arranged in this light-resonating lattice 512A, the wave vector $k\uparrow$ of light which causes resonation will be as follows (with an arbitrary combination of double signs):

$$k_1\uparrow = (\tfrac{1}{3})\times(2\times 3^{0.5}\pi/a, 2\pi/a) \quad (23)$$

$$k_2\uparrow = (\tfrac{1}{3})\times(-2\times 3^{0.5}\pi/a, 2\pi/a) \quad (24)$$

$$k_3\uparrow = (\tfrac{1}{3})\times(0, -4\pi/a) \quad (25)$$

The light-emitting lattice 512B is an oblique lattice having primitive translation vectors $c_1\uparrow = (r_1,1)\times(3^{0.5}a/2)$ and $c_2\uparrow = (r_2,1)\times(3^{0.5}a/2)$. In both the light-resonating lattice 512A and the light-emitting lattice 512B, the lattice points 513B are arranged at intervals of $3^{0.5}a/2$ in the y direction. The primitive reciprocal lattice vectors of this light-emitting lattice 512B are expressed as follows:

$$d_1\uparrow=(1/(r_1+r_2), r_2/(r_1+r_2))\times(4\times3^{-0.5}\pi/a) \quad (26)$$

$$d_2\uparrow=(-1/(r_1+r_2), r_1/(r_1+r_2))\times(4\times3^{-0.5}\pi/2a) \quad (27)$$

The reciprocal lattice vector $G'\uparrow$ is expressed as $G'\uparrow=Pd_1\uparrow+qd_2\uparrow$, where p and q are integers. An inclined beam can be generated by determining $r_1$ and $r_2$ so that the magnitude $|\Delta k\uparrow|=|k\uparrow+G'\uparrow|$ of the vector $\Delta k\uparrow=k\uparrow+G'\uparrow$ is smaller than the radius $(|k\uparrow|/n_{\mathit{eff}})$ of the light cone.

Fifth Embodiment

Figure 12A:
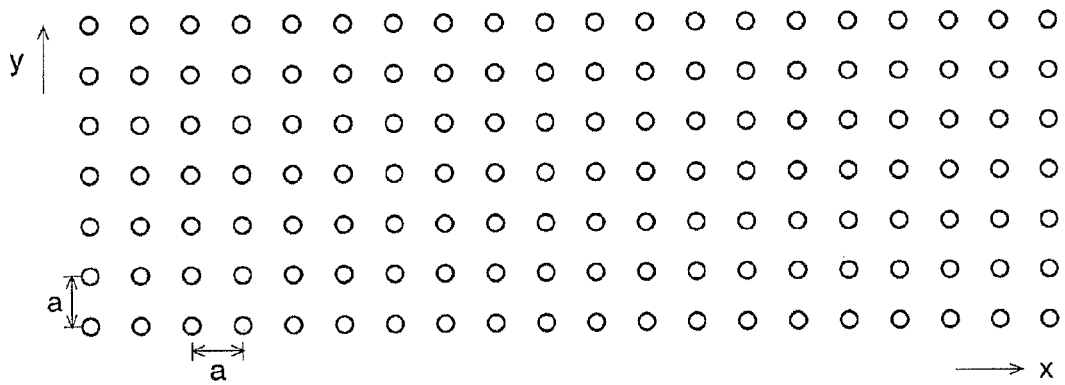
FIGS. 12A and 12B are plan views showing the lattice points at which air holes (modified refractive index areas) are to be arranged in the two-dimensional photonic crystal layer in the variable beam-direction two-dimensional photonic crystal surface emitting laser of the fifth embodiment.
Figure 12B:
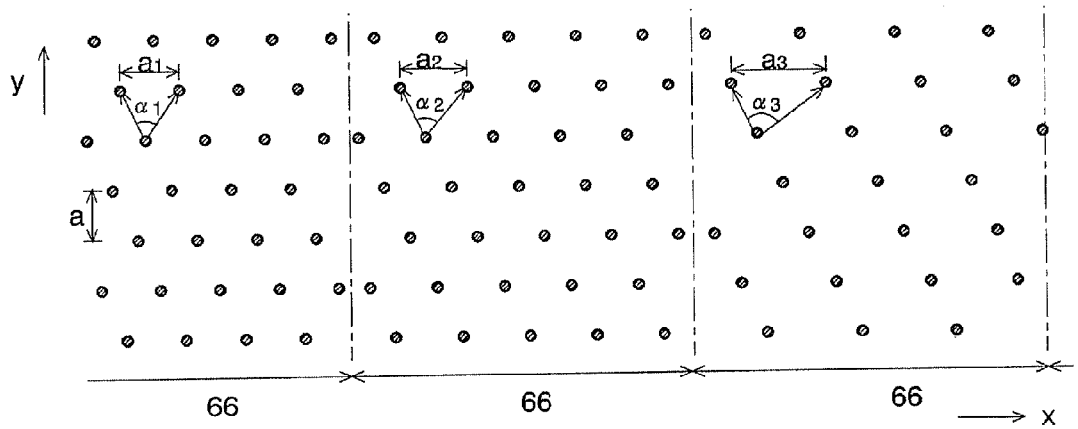
Figure 12C:
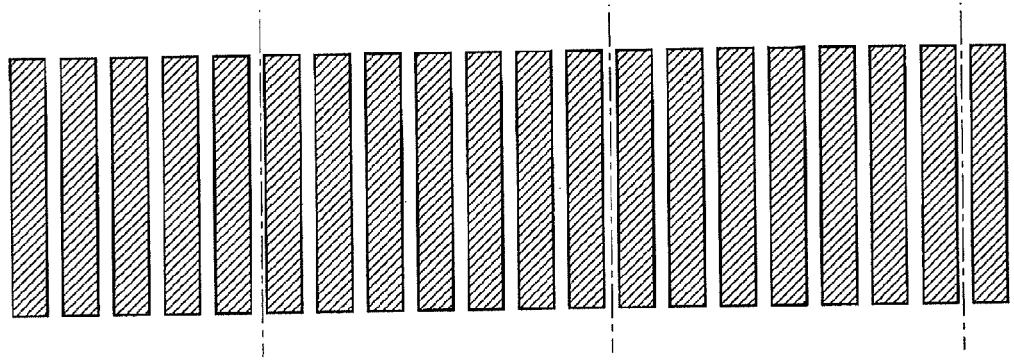
FIG. 12C is a plan view showing an electrode.

As the fifth embodiment, one example of the variable beam-direction photonic crystal laser is hereinafter described by means of FIGS. 12A-12C. In the photonic crystal laser of the fifth embodiment, a two-dimensional photonic crystal layer 61 which will be hereinafter described is used instead of the two-dimensional photonic crystal layer 21 in the first embodiment. Furthermore, an electrode which will be hereinafter described is used instead of the back-side electrode 251 and the window-shaped electrode 252 in the first embodiment. The other components of the photonic crystal laser of the present embodiment are the same as those of the photonic crystal laser 20 of the first embodiment.

The two-dimensional photonic crystal layer 61 is a layer in which air holes (modified refractive index areas) are located at the lattice points of a lattice (not shown) consisting of a light-resonating lattice 612A (FIG. 12A) and a light-emitting lattice 612B (FIG. 12B) superposed on each other. Similar to the first embodiment, the light-resonating lattice 612A is a square lattice with a lattice constant a. The light-emitting lattice 612B is also similar to the first embodiment in that the lattice points are arranged at intervals of a in the y direction. On the other hand, the intervals of the lattice points in the x direction are varied for each of a plurality of areas 66 which are defined by virtually dividing the light-emitting lattice 612B. (These areas are hereinafter called the modified spatial period areas. These are different from the modified refractive index areas.)

A lower electrode 651 and an upper electrode 652 are respectively provided on the lower side of the lower substrate 241 and the upper side of the upper substrate. Each of the lower and upper electrodes 651 and 652 consists of a number of segmented electrodes arranged in the x direction, the width in the x direction of each segmented electrode being smaller than that of the modified spatial period area 66 (FIG. 12C). It is also possible to have only one of the lower and upper electrodes 651 and 652 composed of a number of segmented electrodes and the other made of one sheet of electrode covering the entire range along the x direction.

In the photonic crystal laser of the present embodiment, an electric current is injected into the active layer 22 through only the segmented electrodes located above and/or below one modified spatial period area 66 among the large number of segmented electrodes constituting the lower electrode 651 and/or the upper electrode 652. As a result, rays of light within a wavelength range including a predetermined wavelength are generated in the active layer 22 under that modified spatial period area 66. The light having the predetermined wavelength resonates in that modified spatial period area 66, whereby an inclined beam is emitted. In this device, since the light-emitting lattice 612B has a different structure for each modified spatial period area 66, the emitting direction of the inclined beam can be varied by changing the position of the modified spatial period area 66 in which the light is to be resonated, i.e. by changing the selection of the segmented electrodes for the injection of the electric current among the lower electrode 651 and/or the upper electrode 652.

Sixth Embodiment

Figure 13A:
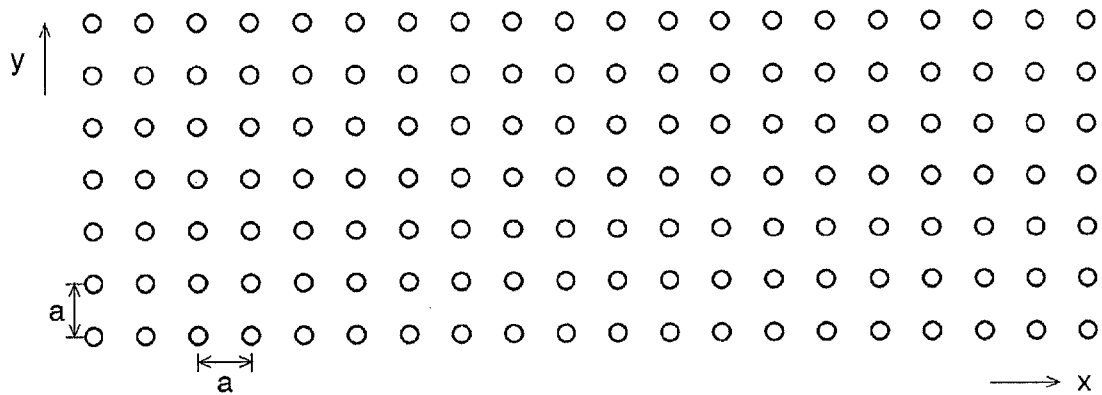
FIGS. 13A and 13B are plan views showing the lattice points at which air holes (modified refractive index areas) are to be arranged in the two-dimensional photonic crystal layer in the variable beam-direction two-dimensional photonic crystal surface emitting laser of the sixth embodiment.

As the sixth embodiment, another example of the variable beam-direction photonic crystal laser is hereinafter described by means of FIGS. 13A-13C. In the photonic crystal laser of the sixth embodiment, a light-emitting lattice 712B which will be hereinafter described is used instead of the light-emitting lattice 612B in the fifth embodiment. Furthermore, an electrode which will be hereinafter described is used instead of the lower electrode 651 or the upper electrode in the fifth embodiment. The other components of the photonic crystal laser of the present embodiment are the same as those of the fifth embodiment.

Figure 13B:
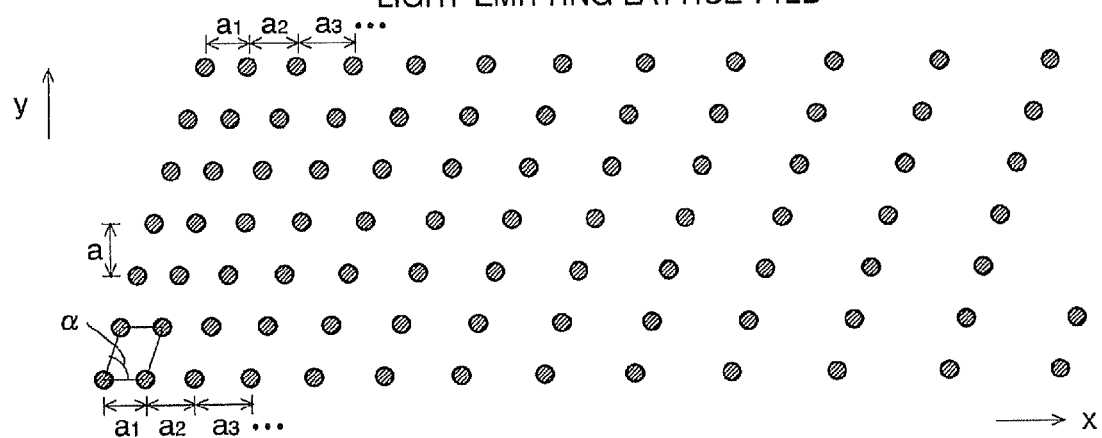
Figure 13C:
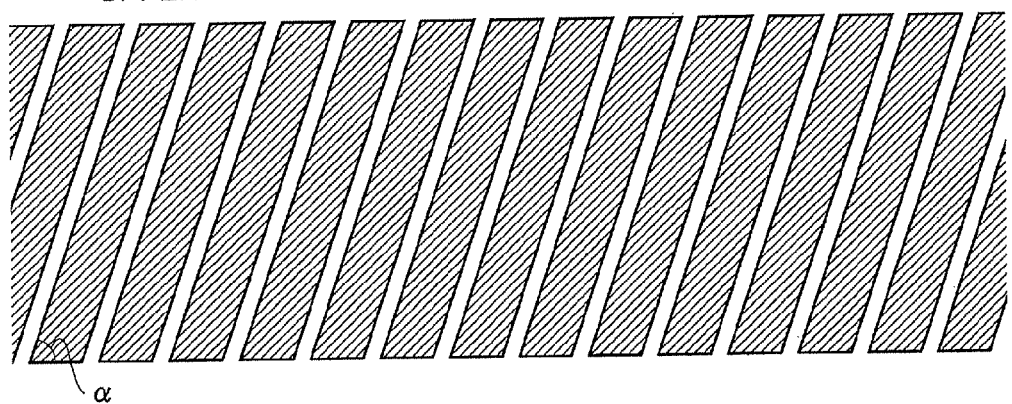
FIG. 13C is a plan view showing an electrode.

The light-emitting lattice 712B is an oblique lattice with the lattice points arranged at progressively increasing intervals of $a_1, a_2, a_3, \ldots (a_1<a_2<a_3 \ldots)$ in the x direction as well as at regular intervals $(a/\sin\alpha)$ in a direction inclined from the x axis by an angle of $\alpha°$ toward the y direction (FIG. 13B). Accordingly, the spatial period in the y direction of the lattice points is a, which is the same as that of the lattice points of the light-resonating lattice 612A.

A lower electrode 751 and an upper electrode 752 are respectively provided on the lower side of the lower substrate 241 and the upper side of the upper substrate. Each of the lower and upper electrodes 751 and 752 consists of a number of segmented electrodes arranged in the x direction, the segmented electrodes having the same shape of a parallelogram with a pair of mutually opposing short sides parallel to the x direction and a pair of parallel long sides forming an angle of $\alpha°$ with the short sides (FIG. 13C). It is also possible to have only one of the lower and upper electrodes 751 and 752 composed of a number of segmented electrodes and the other one made of one sheet of electrode covering the entire range in the x direction.

In the photonic crystal laser of the present embodiment, an electric current is injected into the active layer 22 through one segmented electrode or a plurality of neighboring segmented electrodes among the large number of segmented electrodes constituting the lower electrode 751 and/or the upper electrode 752. As a result, rays of light within a wavelength range including a predetermined wavelength are generated in a current-injected area of the active layer 22 into which the electric current has been injected. The light having the predetermined wavelength resonates in a partial area of the light-resonating lattice 612A facing the current-injected area. As a result, an inclined beam is emitted at an inclination angle determined by the structure of the light-emitting lattice 712E included in that partial area. Accordingly, the emitting direction of the inclined beam can be varied by changing the selection of the segmented electrode or electrodes for the injection of the electric current among the large number of segmented electrodes constituting the lower electrode 751 and/or the upper electrode 752.

Figure 14A:
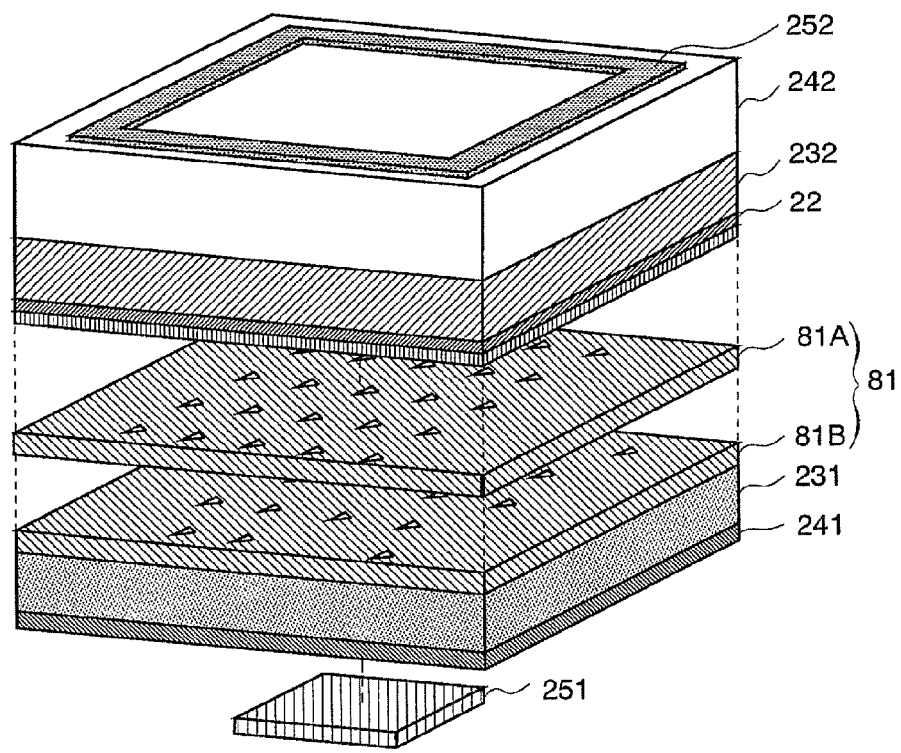
FIGS. 14A and 14B are perspective views showing variations of the first through sixth embodiments.
Figure 14B:
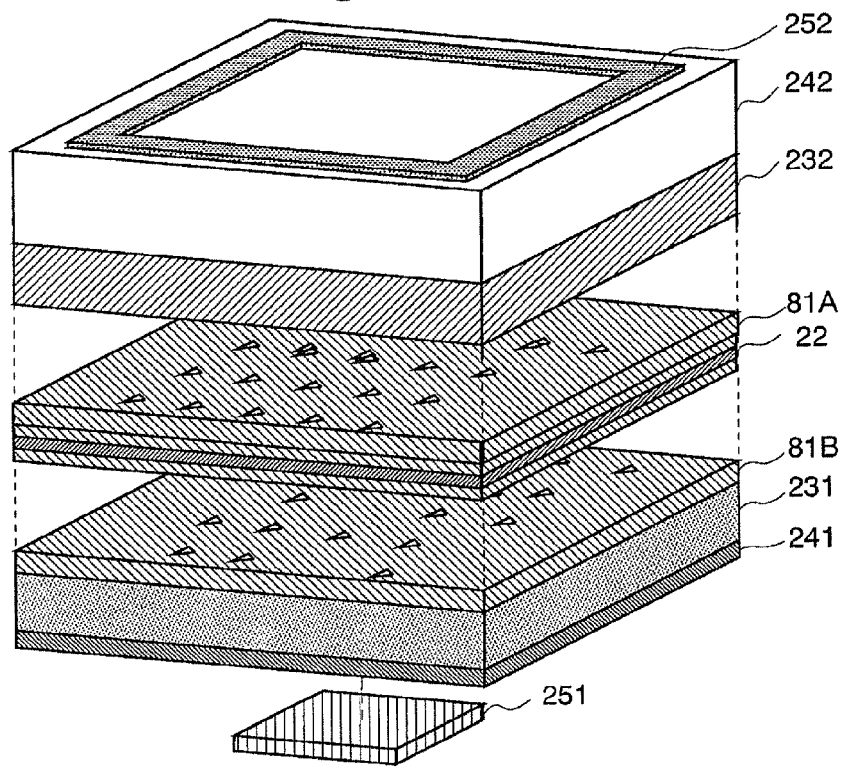

In any of the previously described first through sixth embodiments, both the light-resonating photonic crystal structure and the light-emitting photonic crystal structure are formed in one layer. The two-dimensional photonic crystal layer 81 shown in FIG. 14A is another possible example, which has a double-layer structure including a first layer 81A having the light-resonating photonic crystal structure and a second layer 81B having the light-emitting photonic crystal structure. Although both the first layer 81A and the second layer 81B in the example of FIG. 14A are provided on the side of the active layer 22 closer to the back-side electrode 251, it is possible to provide both of these layers on the side of the active layer 22 closer to the window-shaped electrode 252. It is also possible to provide one of the first and second layers 81A and 81B on the side of the active layer 22 closer to the back-side electrode 251 and the other layer on the side closer to the window-shaped electrode 252, i.e. to have the active layer 22 sandwiched between the first layer 81A and the second layer 81B, as shown in FIG. 14B.

EXPLANATION OF NUMERALS 10, 20 . . . Photonic Crystal Laser
10A, 10B, 10C . . . Light-Resonating Photonic Crystal Structure
111A, 112A, 413B, 513B . . . Lattice Point
11A, 11B, 11C, 213A, 213B . . . Lattice Point
13A, 13B . . . M Point
14, 14A, 14B, 14C . . . Light Cone
15 . . . Light-Emitting Photonic Crystal Structure
16A . . . Modified Refractive Index Area
21, 31, 41, 51, 61 . . . Two-Dimensional Photonic Crystal Layer
211, 411, 511 . . . Air Hole
212A, 412A, 512A, 612A . . . Light-Resonating Lattice
212B, 312B, 412B, 512B, 612B . . . Light-Emitting Lattice
212C, 312C, 412C, 512C . . . Lattice
214 . . . Base Member (Slab)
22 . . . Active Layer
231 . . . First Cladding Layer
232 . . . Second Cladding Layer
241 . . . Lower Substrate
242 . . . Upper Substrate
251 . . . Back-Side Electrode
252 . . . Window-Shaped Electrode
651 . . . Lower Electrode
652 . . . Upper Electrode
66 . . . Modified Spatial Period Area

The invention claimed is:

1. A two-dimensional photonic crystal surface emitting laser having a laminated structure comprising:
   a) an active layer for generating light within a predetermined wavelength range by receiving an injection of an electric current; and
   b) a two-dimensional photonic crystal layer made of a two-dimensional photonic crystal having a plate-shaped base member in which modified refractive index areas whose refractive index differs from that of the base member are arranged, wherein the two-dimensional photonic crystal layer includes:
      b-1) a light-resonating photonic crystal structure with modified refractive index areas located at lattice points of a light-resonating lattice whose periodicity is determined so that a resonant state of light of emission wavelength λ which is a wavelength within the aforementioned wavelength range is created by forming a two-dimensional standing wave while the light of emission wavelength λ is prevented from being emitted to an outside; and
      b-2) a light-emitting photonic crystal structure with modified refractive index areas located at lattice points of a lattice having a reciprocal lattice vector G'↑ in a reciprocal space, where a magnitude of a sum of the reciprocal lattice vector G'↑ and a wave vector k↑ corresponding to the emission wavelength λ within the light-resonating photonic crystal structure is greater than zero and less than ($|k↑|/n_{eff}$).

2. The two-dimensional photonic crystal surface emitting laser according to claim 1, wherein:
   1) the light-resonating photonic crystal structure has modified refractive index areas located at lattice points of a light-resonating lattice which is a square lattice in real space, the square lattice having a lattice constant a determined by equation (1):

$$a = \frac{1}{\sqrt{2}} \frac{\lambda}{n_{eff}} \quad (1)$$

where λ is an emission wavelength within the aforementioned wavelength range and $n_{eff}$ is an effective refractive index of the two-dimensional photonic crystal layer; and
   2) the light-emitting photonic crystal structure has modified refractive index areas located at lattice points of a lattice having a reciprocal lattice vector G'↑ in a reciprocal space, where a magnitude of a sum of the reciprocal lattice vector G'↑ and any of the wave vectors k↑=±(½)b₁↑±(½)b₂↑ corresponding to the emission wavelength λ within the light-resonating photonic crystal structure (with an arbitrary combination of double signs, where b₁↑ and b₂↑ are two primitive reciprocal lattice vectors in the square lattice of the light-resonating photonic crystal structure) is smaller than ($|k↑|/n_{eff}$).

3. The two-dimensional photonic crystal surface emitting laser according to claim 1, wherein:
   1) the light-resonating photonic crystal structure has modified refractive index areas located at lattice points which form a rectangular lattice in real space, the lattice points being determined by equation (2):

$$\frac{1}{2}\sqrt{\frac{1}{a_1^2} + \frac{1}{a_2^2}} = \frac{n_{eff}}{\lambda} \quad (2)$$

where $a_1$ and $a_2$ are lattice constants of the rectangular lattice, λ is an emission wavelength within the aforementioned wavelength range and $n_{eff}$ is an effective refractive index of the two-dimensional photonic crystal layer; and
   2) the light-emitting photonic crystal structure has modified refractive index areas located at lattice points of a lattice having a reciprocal lattice vector G'↑ in a reciprocal space, where a magnitude of a sum of the reciprocal lattice vector G'↑ and any of the wave vectors k↑=±(½)b₁↑±(½)b₂↑ corresponding to the emission wavelength λ within the light-resonating photonic crystal structure (with an arbitrary combination of double signs, where b₁↑ and b₂↑ are two primitive reciprocal lattice vectors in the rectangular lattice of the light-resonating photonic crystal structure) is smaller than ($|k↑|/n_{eff}$).

4. The two-dimensional photonic crystal surface emitting laser according to claim 1, wherein:
   1) the light-resonating photonic crystal structure has modified refractive index areas located at lattice points which form a triangular lattice in real space, the lattice points being determined by equation (3):

$$a = \frac{2}{3} \frac{\lambda}{n_{eff}} \quad (3)$$

where a is a lattice constant of the triangular lattice, λ is an emission wavelength within the aforementioned wavelength range and $n_{eff}$ is an effective refractive index of the two-dimensional photonic crystal layer; and 2) the light-emitting photonic crystal structure has modified refractive index areas located at lattice points of a lattice having a reciprocal lattice vector $\vec{G'}$ in a reciprocal space, where a magnitude of a sum of the reciprocal lattice vector $\vec{G'}$ and any of the wave vectors $\vec{k} = (\frac{1}{3})\vec{b_1}+(\frac{1}{3})\vec{b_2}$, $(-\frac{2}{3})\vec{b_1}+(\frac{1}{3})\vec{b_2}$, and $(\frac{1}{3})\vec{b_1}-(\frac{2}{3})\vec{b_2}$ corresponding to the emission wavelength $\lambda$ within the light-resonating photonic crystal structure (where $\vec{b_1}$ and $\vec{b_2}$ are two primitive reciprocal lattice vectors in the triangular lattice of the light-resonating photonic crystal structure) is smaller than ($|\vec{k}|/n_{\mathit{eff}}$).

5. The two-dimensional photonic crystal surface emitting laser according to claim 2, wherein:
the light-emitting photonic crystal structure has the modified refractive index areas located at the lattice points of an oblique lattice with primitive translation vectors that are $\vec{c_1}=(r_1,1)a$ and $\vec{c_2}=(r_2,1)a$ in a real space having an orthogonal coordinate system with x and y directions corresponding to directions of the two primitive translation vectors in the light-resonating photonic crystal structure, wherein the x direction is one of the two directions in which lattice points are aligned with the lattice constant a; and
a laser beam is emitted in a direction at an inclination angle $\theta$ from a normal to the two-dimensional photonic crystal layer and an azimuthal angle $\phi$ with respect to the x direction, with $\theta$ and $\phi$ satisfying following relationships:

$$r_1 = \frac{n_{\mathit{eff}} + \sqrt{2}\sin\theta\sin\phi}{n_{\mathit{eff}} - \sqrt{2}\sin\theta\cos\phi} \quad (4)$$

$$r_2 = \frac{n_{\mathit{eff}} - \sqrt{2}\sin\theta\sin\phi}{n_{\mathit{eff}} - \sqrt{2}\sin\theta\cos\phi}. \quad (5)$$

6. The two-dimensional photonic crystal surface emitting laser according to claim 1, wherein the two-dimensional photonic crystal layer has a single-layer structure in which the light-resonating photonic crystal structure and the light-emitting photonic crystal structure are created in a superimposed form.

7. The two-dimensional photonic crystal surface emitting laser according to claim 1, wherein:
a current-injecting position controller for controlling a position at which the electric current is injected into the active layer is further provided; and
a periodic structure of the light-emitting photonic crystal structure varies depending on a position in the two-dimensional photonic crystal layer.

8. The two-dimensional photonic crystal surface emitting laser according to claim 7, wherein the light-emitting photonic crystal structure has a plurality of modified spatial period areas having different periodic structures.

9. The two-dimensional photonic crystal surface emitting laser according to claim 7, wherein the periodic structure of the light-emitting photonic crystal structure continuously varies depending on the position in the two-dimensional photonic crystal layer.

10. The two-dimensional photonic crystal surface emitting laser according to claim 7, wherein the current-injecting position controller has a pair of electrodes for injecting the electric current into the active layer, and one or both of the electrodes are composed of a plurality of segmented electrodes arranged parallel to the active layer.

11. The two-dimensional photonic crystal surface emitting laser according to claim 2, wherein the two-dimensional photonic crystal layer has a single-layer structure in which the light-resonating photonic crystal structure and the light-emitting photonic crystal structure are created in a superimposed form.

12. The two-dimensional photonic crystal surface emitting laser according to claim 2, wherein:
a current-injecting position controller for controlling a position at which the electric current is injected into the active layer is further provided; and
a periodic structure of the light-emitting photonic crystal structure varies depending on a position in the two-dimensional photonic crystal layer.

13. The two-dimensional photonic crystal surface emitting laser according to claim 3, wherein the two-dimensional photonic crystal layer has a single-layer structure in which the light-resonating photonic crystal structure and the light-emitting photonic crystal structure are created in a superimposed form.

14. The two-dimensional photonic crystal surface emitting laser according to claim 3, wherein:
a current-injecting position controller for controlling a position at which the electric current is injected into the active layer is further provided; and
a periodic structure of the light-emitting photonic crystal structure varies depending on a position in the two-dimensional photonic crystal layer.

15. The two-dimensional photonic crystal surface emitting laser according to claim 4, wherein the two-dimensional photonic crystal layer has a single-layer structure in which the light-resonating photonic crystal structure and the light-emitting photonic crystal structure are created in a superimposed form.

16. The two-dimensional photonic crystal surface emitting laser according to claim 4, wherein:
a current-injecting position controller for controlling a position at which the electric current is injected into the active layer is further provided; and
a periodic structure of the light-emitting photonic crystal structure varies depending on a position in the two-dimensional photonic crystal layer.

* * * * *